United States Patent [19]

Luke et al.

[11] Patent Number: 5,483,603
[45] Date of Patent: Jan. 9, 1996

[54] SYSTEM AND METHOD FOR AUTOMATIC OPTICAL INSPECTION

[75] Inventors: Edward P. Luke, Oakdale; Damien W. P. Creavin, New York, both of N.Y.; Robert R. Reetz, Apex, N.C.

[73] Assignee: Advanced Interconnection Technology, Islip, N.Y.

[21] Appl. No.: 324,454

[22] Filed: Oct. 17, 1994

Related U.S. Application Data

[63] Continuation of Ser. No. 964,705, Oct. 22, 1992, abandoned.

[51] Int. Cl.$^6$ .................................................. G06K 9/00
[52] U.S. Cl. ........................................ 382/147; 382/162
[58] Field of Search ................................ 382/8, 30, 34, 382/17, 87, 141, 145, 147, 162, 165, 209, 217, 218; 348/87, 42, 126, 179

[56] References Cited

U.S. PATENT DOCUMENTS

| | | | |
|---|---|---|---|
| 4,578,810 | 3/1986 | MacFarlane et al. | 382/8 |
| 4,635,289 | 1/1987 | Doyle et al. | 382/8 |
| 4,661,984 | 4/1987 | Bentley | 382/8 |
| 4,680,627 | 7/1987 | Sase et al. | 358/101 |
| 4,745,296 | 5/1988 | Driller et al. | 382/8 |
| 4,776,022 | 10/1988 | Fox et al. | 382/8 |
| 4,783,826 | 11/1988 | Koso | 382/8 |
| 4,790,022 | 12/1988 | Dennis | 382/8 |
| 4,799,175 | 1/1989 | Sano et al. | 382/8 |
| 4,830,497 | 5/1989 | Iwata et al. | 382/8 |
| 4,893,346 | 1/1990 | Bishop | 382/8 |
| 4,908,871 | 3/1990 | Hara et al. | 382/8 |
| 4,928,169 | 5/1990 | Lebel et al. | 382/8 |
| 4,962,540 | 10/1990 | Tsujiuchi et al. | 382/17 |
| 4,991,223 | 2/1991 | Bradley | 382/17 |
| 5,027,417 | 6/1991 | Kitekado et al. | 358/106 |
| 5,083,087 | 1/1992 | Fox et al. | 374/537 |
| 5,204,912 | 4/1993 | Schimanski | 382/8 |

FOREIGN PATENT DOCUMENTS

| | | |
|---|---|---|
| 231941A3 | 8/1987 | European Pat. Off. . |
| 247308A3 | 12/1987 | European Pat. Off. . |
| 263473A3 | 4/1988 | European Pat. Off. . |
| 370435A3 | 5/1990 | European Pat. Off. . |
| 435660A3 | 7/1991 | European Pat. Off. . |
| 2124362 | 2/1984 | United Kingdom . |

OTHER PUBLICATIONS

"A Novel Color Transformation Algorithm And Its Applications", K. Kanamori et al., *SPIE* vol. 1244 Image Processing Algorithms and Techniques (1990).

"Color Image Segmentation And Color Constancy", R. Bajcsy, et al., *SPIE* vol. 1250 Perceiving, Measuring, and Using Color (1990).

Electronic Imaging International, Minicourse #13, New Developments in Machine Vision, "Low–Cost colour vision" pp. 14–15, Sep. 29–Oct., 2, 1992.

"New Multiwire meets the challenge of interconnecting chip–carriers", G. Messner, et al., *Electronics*, vol. 52 (Dec. 20, 1979).

Image Inspection Limited (II), product literature, date unknown.

"The Use of Color in Integrated Circuit Inspection", M. Barth, et al., *SPIE* vol. 1250 Perceiving, Measuring, and Using Color (1990).

*Primary Examiner*—Joseph Mancuso
*Attorney, Agent, or Firm*—Morgan & Finnegan

[57] ABSTRACT

An optical inspection system for inspecting faults on circuit boards like printed circuit boards and wire scribed circuit boards is disclosed. A video camera for receiving desired images of hole sites on a wire circuit board is provided. The camera converts each image to electrical video signals. A frame grabber converts electrical video signals to a plurality of pixels and stores information representing color element values contained in each of the pixels. A panel feature detector receives the color element values of the pixel that has to be analyzed and provides a wire indication when the color element value of the pixel corresponds to the wire feature. A fault detector circuit receives the wire indication from the panel feature detector corresponding to predetermined pixels associated with the hole site for determining faults on the circuit board.

40 Claims, 16 Drawing Sheets

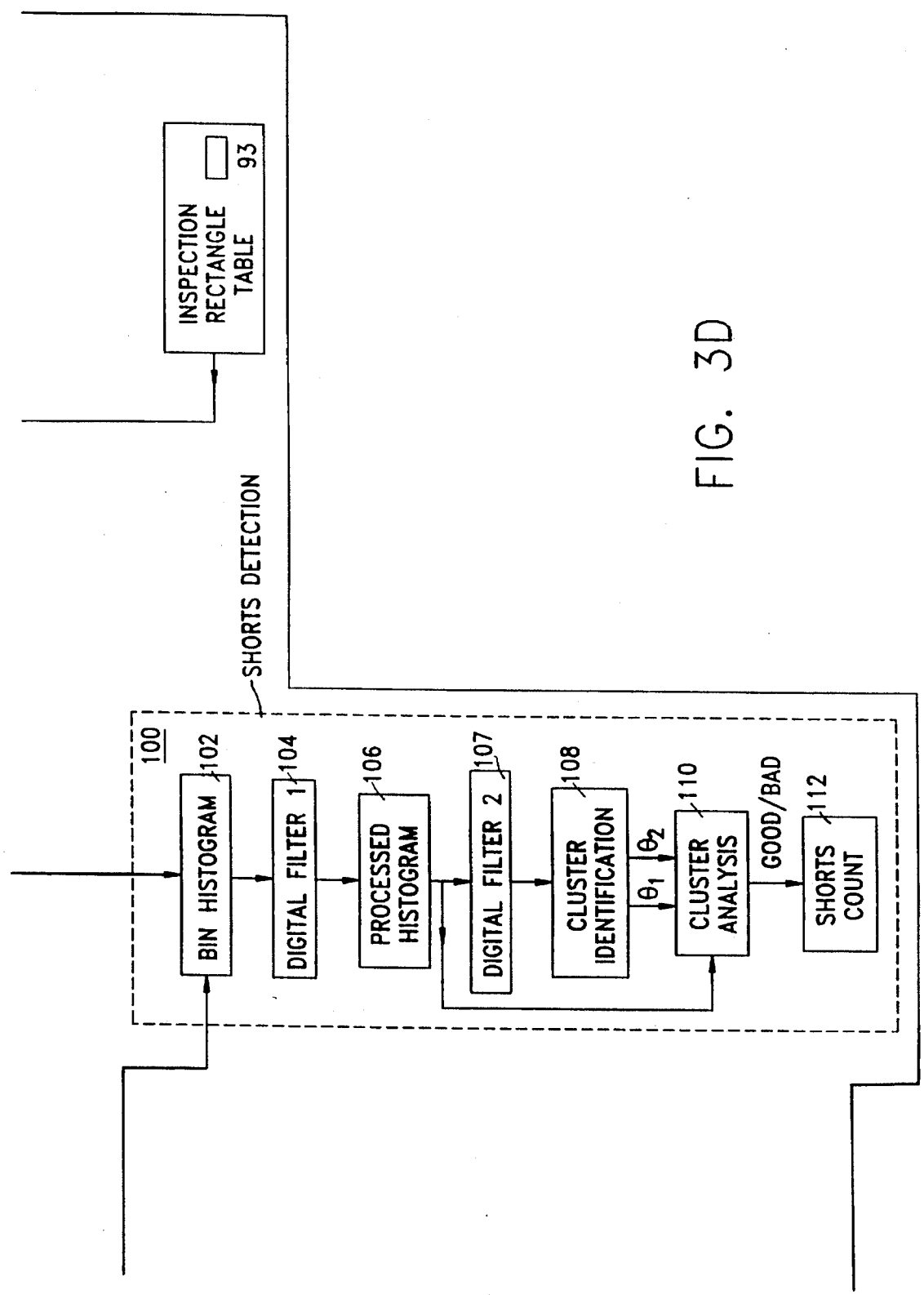

| R | G | B | | R | G | B |
|---|---|---|---|---|---|---|
| 0 | 0 | 0 | | 0 | 2 | 7 |
| 0 | 0 | 1 | | 0 | 3 | 0 |
| 0 | 0 | 2 | | 0 | 3 | 1 |
| 0 | 0 | 3 | 162 | 0 | 3 | 2 |
| 0 | 0 | 4 | | 0 | 3 | 3 |
| 0 | 0 | 5 | | 0 | 3 | 4 |
| 0 | 0 | 6 | | | | |
| 0 | 0 | 7 | | 0 | 63 | 7 |
| 0 | 1 | 0 | | 1 | 0 | 0 |
| 0 | 1 | 1 | | 1 | 0 | 1 |
| 0 | 1 | 2 | | | | |
| 0 | 1 | 3 | | 1 | 63 | 7 |
| 0 | 1 | 4 | | 2 | 0 | 0 |
| 0 | 1 | 5 | | | | |
| 0 | 1 | 6 | | 20 | 63 | 7 |
| 0 | 1 | 7 | | 21 | 0 | 0 |
| 0 | 2 | 0 | | | | |
| 0 | 2 | 1 | | 63 | 63 | 2 |
| 0 | 2 | 2 | | 63 | 63 | 3 |
| 0 | 2 | 3 | | 63 | 63 | 4 |
| 0 | 2 | 4 | | 63 | 63 | 5 |
| 0 | 2 | 5 | | 63 | 63 | 6 |
| 0 | 2 | 6 | | 63 | 63 | 7 |

FIG. 7
| SCAN LINE # | PIXEL/BIN |
|---|---|
| m | $x_1, x_2 .... x_n$ |
| ⋮ | ⋮ ⋮ ⋮ |
90
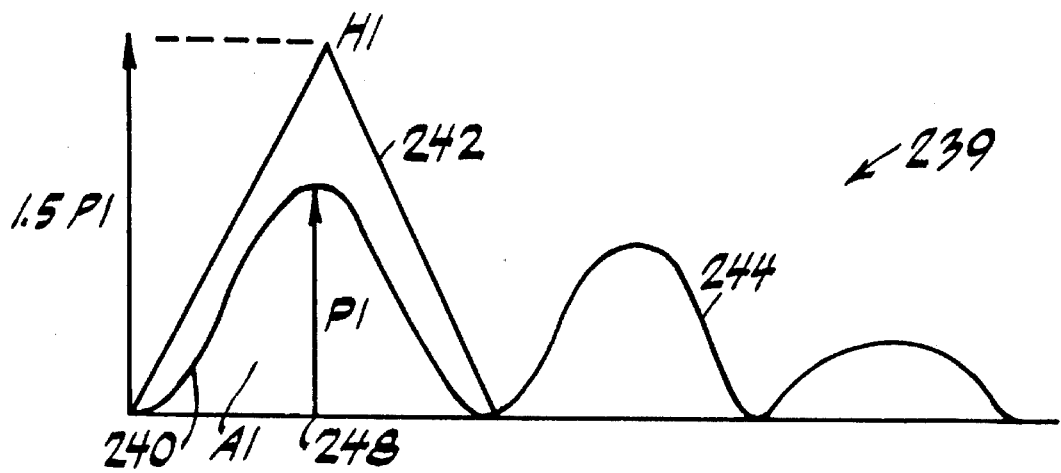
FIG. 8A
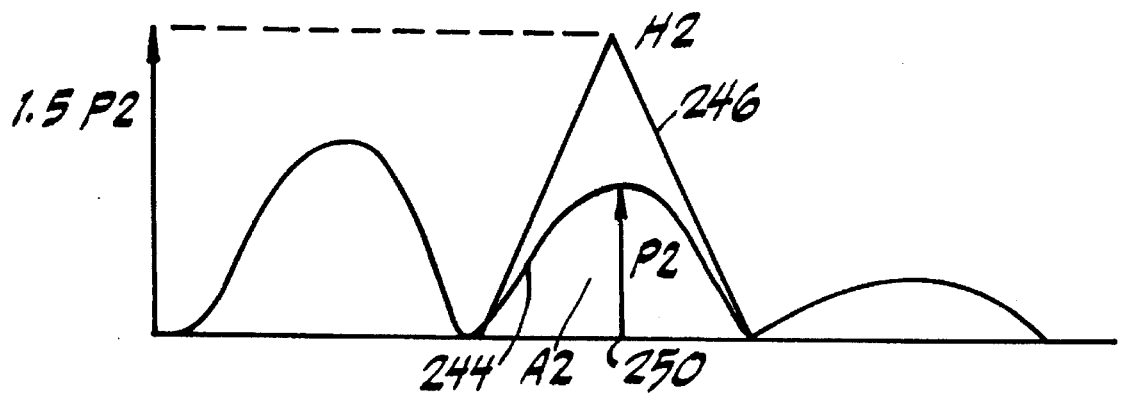
FIG. 8B

| 250 | 252 | 254 | 256 | 258 | 260 | 262 | 264 |
|---|---|---|---|---|---|---|---|
| H | X | Y | $V_{entry}$ | $V_{exit}$ | K | S | O |

| 266 | 268 | 270 | 272 | 274 | 276 |
|---|---|---|---|---|---|
| H | OPEN | SHORT I.D. | KEEP OUT | OPEN | SHORT I.D. | KEEP OUT |

SYSTEM AND METHOD FOR AUTOMATIC OPTICAL INSPECTION

This is a continuation of application Ser. No. 07/964,705, filed on Oct. 22, 1992, now abandoned.

This invention relates to an automatic optical inspection system and, more particularly, to an optical inspection system for inspecting faults in high density and high volume discrete wiring panels or wire scribed circuit boards.

BACKGROUND OF THE INVENTION

In recent times, the electronics industry has moved towards more compact integrated circuit packages with surface-mounted terminals. The density of wiring patterns have tremendously increased within the recent past. Therefore, many circuit board applications today utilize discrete wiring technology which includes insulated wires crossing over each other. Consequently, signal paths can run in X, Y, and non-axial directions on the same substrate.

Accordingly, insulated wire is scribed into an insulating substrate by feeding a continuous strand of wire onto the surface of the substrate while simultaneously affixing the wire and cutting it at predetermined interconnection points. Thus, a wire image of a predetermined interconnect pattern results, which includes discrete or discontinuous wire pieces affixed to the substrate. A wire scribed circuit board is described in U.S. Pat. No. 3,674,914.

Interconnection points exist at the ends of wires and at certain intermediate points along wires in the form of metal plated holes which provide conductive paths to the terminals of external components.

The locations and the sizes of the holes are predetermined and replicable for each wire scribe board. Generally, it is preferred to first apply the insulated, preformed conductor wires to the board surface along a pre-programmed path and to then drill or lase the board at hole sites which are those locations at which terminals are to be located. Plating material may then enter the holes, connecting the wire terminations to external pads.

Once a discrete wiring board has been scribed, it is necessary to inspect the board for any wiring errors. Conventionally, a human operator may inspect the board visually. However, for a typical board there is a multitude of wires, which renders visual inspection highly inefficient and error-prone. The problem is critical at interconnection sites. Since the scribed wires at drilling points are stripped for later connections, any scribing error may cause a "short" or an "open" at an interconnection site.

Automatic optical inspection systems have been quite useful in detecting faults compared to visual inspection by human operators. Conventionally, automatic optical inspection machines have been implemented based on two fundamental methods. The first method is the design rule approach. This method scans a board in search of minimum design rule violations which are detectable within the span of a very small window. Minimum trace width and trace separation violations, as well as minuscule defects like scratches are targets of the design rule check.

The second method is the reference comparison approach. The reference method compares the test board, pixel by pixel to a representation of a "golden board" stored in a memory.

A prevalent automatic optical inspection architecture includes panel illumination with incoherent light, and image detection with a monochrome charge coupled device (CCD) array. For such systems, inspection of artwork and hole sites is provided by back-lighting, and inspection of conductor against substrate is accomplished by top-lighting. In back-lighting, the illumination and detection hardware are located on opposite sides of the article under inspection. In top-lighting, the detection hardware and illumination emitter are located on the same side.

Automatic optical inspection with top-lighting is based on illuminating the board and detecting different intensities of reflected light. Thus, conductor and substrate may be recognized by the amount of their reflected light. For example, bright shiny copper can be easily differentiated from dull dark substrate.

However, inspection of copper oxide is not as easy. A difficult inspection task is detection of faults at solder sites. Difficulties arise because solder has an irregularly shaped three dimensional surface and is very shiny. These qualities cause it to reflect light in an irregular manner. Inspection of discrete wiring boards has proven to be very difficult as well. Like solder, wire has a curved three dimensional surface which reflects light irregularly. The way the wire was scribed, whether adhesive has oozed over it, whether it has suffered any abrasion and the existence of nearby crossovers, are all determinants as to the manner in which it reflects light. Furthermore, a discrete wiring panel prior to encapsulation is strewn with topographic features other than wire. Bumps, scratches, troughs and ridges in the soft shiny substrate can result in bright reflections which act as wire impostors to conventional automatic optical inspection systems.

For example, when viewing a discrete wiring board illuminated from the top, the distribution of wire and substrate brightness fall into two broad overlapping domains. In the region of overlap, analysis based solely on light intensity is subject to potential confusion as to the type of material present. Consideration of spatial structure can help to reduce ambiguity, but it is computationally expensive, and often still not decisive. Thus, it becomes necessary to treat marginal decisions conservatively, to err in favor of rejecting good points on a panel rather than authorizing bad points. Such rejection criteria are a further disadvantage with conventional automatic inspection systems.

The task of differentiating wire from substrate becomes even more difficult when the color of the scribed wire is similar to the color of the substrate. In this event, the wire and substrate brightness can overlap substantially, causing many false rejections.

Thus, there is a need to inspect highly dense circuit boards with high efficiency and reliability, without the disadvantages described hereinabove.

SUMMARY OF THE INVENTION

Therefore, it is an object of the present invention to provide a reliable system for automatic optical inspection of circuit boards generally.

It is also an object of the present invention to provide a system and a method for automatic optical inspection of discrete wire circuit boards including printed circuit subcomponents of discrete wire circuit boards.

It is a still further object of the present invention to provide a color based automatic optical inspection system for inspecting circuit boards including printed circuit boards and discrete wire circuit boards.

It is also an object of the present invention to provide a color based automatic optical inspection system with the ability to distinguish substrate and wires having similar colors.

Another object of the present invention is to provide an automatic optical inspection system capable of measuring panel stretch and shrinkage as indicated by shifts in the position of registration coupons.

It is also a further object of the present invention to provide an automatic optical inspection system capable of compensating for any errors arising from incorrectly aligning a circuit board on the inspection X-Y table.

Accordingly, a video camera is disposed above the wiring board that needs to be inspected. The video camera receives images of the board and sends the information to an analyzer which conducts the analysis portion of the system. The system uses all color information received from the video camera, and works directly with "Red", "Green", "Blue" (RGB) lookup tables. In another embodiment of the present invention, the image data in RGB format is converted to image data in "Hue" "Saturation" "Intensity" (HSI) format. The system then uses the hue component of the HSI data but ignores the saturation and intensity components, in order to produce the highest possible processing speed. In another embodiment of the present invention, instead of lookup tables, neural network technology operating directly on RGB data may be used to differentiate between wire and substrate.

The system establishes three dimensional lookup table representing RGB space. A large fraction of all RGB values belonging exclusively to wire features then address set bits in the wire lookup table. All RGB values which could belong to a substrate feature must address a zero bit in the wire lookup table. Conversely, a large fraction of all RGB values belonging exclusively to substrate features would then address set bits in the substrate lookup table.

The system is first operated in a training mode to sample wire and substrate areas and therefore set up the corresponding wire lookup and substrate lookup table. Each time a sample is made, the areas which the system has been trained to associate with substrate turn green, and the areas which the system has been trained to associate with wire turns bright red.

During actual inspection, interconnection sites are checked for open and short conditions. A reference file contains information describing the correct wiring at each interconnection site, including the hole type, and the angle of entry and departure of each wire. If an inspected interconnection site appears inconsistent with the reference file, a fault is deemed detected.

Other objects and many attendant advantages of the present invention will become apparent as the invention is more fully described.

BRIEF DESCRIPTION OF THE DRAWINGS

FIGS. 3A–3D illustrate a functional block diagram of an embodiment of the present invention.

FIG. 5 illustrates the structure of wire and substrate lookup tables according to one embodiment of the present invention.

FIG. 7 illustrates an example of pixel/bin map 90.

FIGS. 8A and 8B illustrate diagrams of the processed histogram provided by the processed histogram memory.

FIGS. 10A–10B illustrate a job file which contains pertinent information about all the hole sites to be inspected on a panel.

DETAILED DESCRIPTION OF THE DRAWINGS

Figure 1:
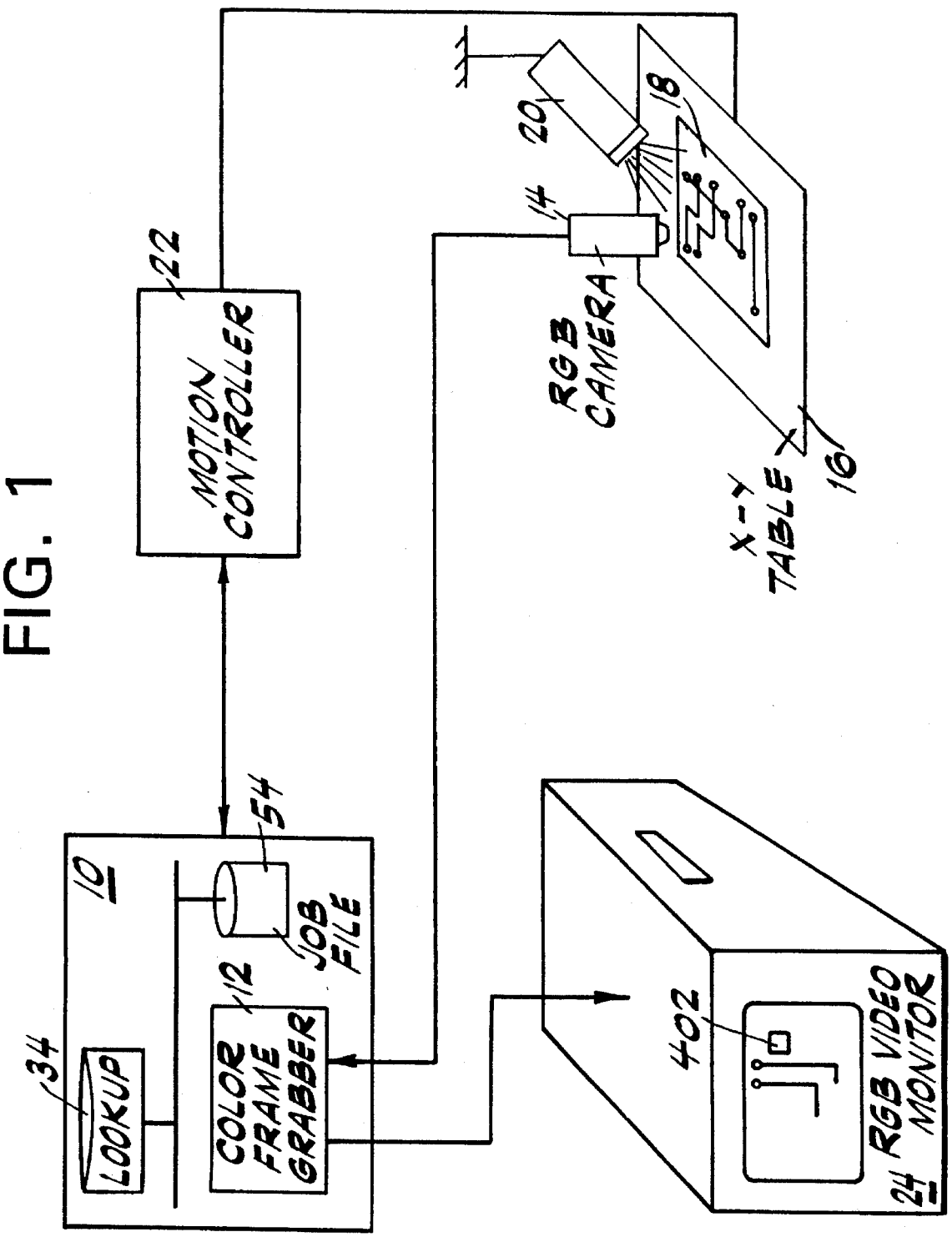
FIG. 1 illustrates one embodiment of the present invention for automatic optical inspection of circuit boards.

FIG. 1 illustrates an embodiment of the present invention for automatic optical inspection of circuit boards.

Computer 10 controls the operation of the system. Computer 10 may be an inexpensive personal computer with preferably a 16 bit or 32 bit microprocessor.

A frame grabber 12 is connected to the computer. The frame grabber may occupy one slot in the computer backplane. Frame grabber 12 may be one of the readily commerically available components.

Frame grabber 12 is coupled to an RGB video camera 14. The video camera is disposed above a moveable X-Y table 16. The X-Y table can be moved along the X and Y axes. On top of the table 16, a discrete wiring panel 18 is disposed for inspection.

A light illuminator 20 provides incident light on the discrete wiring panel 18. A motion controller 22 is connected to the input/output port of computer 10 and X-Y table 16.

An RGB video monitor 24 is connected to frame grabber 12 and provides a visual image of the discrete wiring panel site viewed by RGB video camera 14. RGB video camera 14 includes a plurality of charge coupled device arrays receiving reflected light from the discrete wiring panel 18. Frame grabber 12 receives images from the RGB video camera 14 in RGB format. Therefore, each element in the image is represented by distinct red, green and blue components.

Frame grabber 12 converts analog signals representing the image viewed by the RGB video camera into a digital two dimensional array. The size of the digital two dimensional array in the frame grabber is 512×480 pixels in U.S. and 512×512 pixels in Europe. There is also a fixed correspondence between positions on the photoreceptor chip of the RGB video camera 14 and the two dimensional array of frame grabber 12. Therefore, every pixel location in the two dimensional digital array of frame grabber 12 corresponds to a unique position in the image detected by the RGB camera.

Thus, the data provided by frame grabber 12 is readily available for the computer's use in a convenient format.

Motion controller 22 receives instructions from computer 10 to move the X-Y table 16 to a desired location. Thus, all points on the discrete wiring panel 18 may be inspected by RGB video camera 14.

Figure 2A:
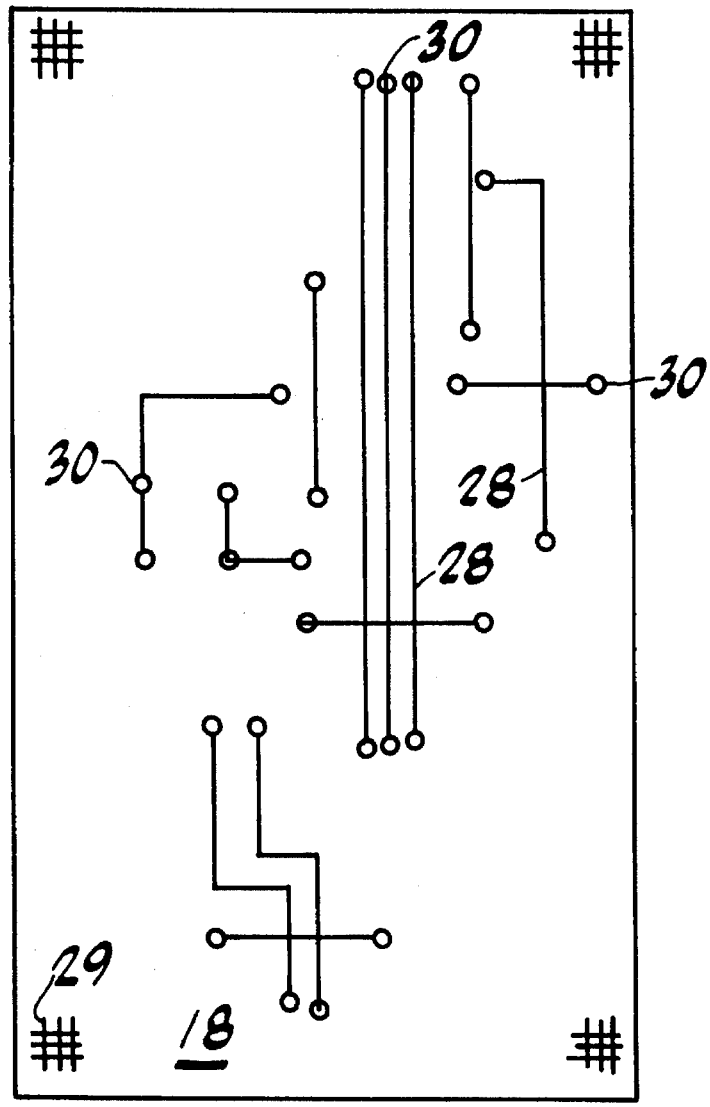
FIG. 2A illustrates an example of a discrete wiring panel to be inspected in accordance with the present invention.

FIG. 2A illustrates an example of a discrete wiring panel to be inspected in accordance with the present invention. A plurality of scribed wires 28 are disposed on the panel. Wires pass through or end at interconnection sites 30. As illustrated, some of the interconnection sites have no wires crossing through them. Such sites may be drilled later to provide through holes used for power and ground terminations or for mechanical purposes. Interconnection sites 30 are hole sites that will be drilled in a later stage of discrete wiring panel manufacturing.

Each hole site on the discrete wiring panel has a predetermined location and a corresponding predetermined diameter.

Each discrete wiring panel 18 has four registration coupons 29, one at each corner of the panel. Panels of different sizes have coupons in different nominal positions, the coordinates of which are stored in a file accessible to computer 10. The registration coupons provide reference points so that the exact locations of predetermined hole sites may be found on each panel with accuracy.

In order to enable the system to distinguish between a wire and a substrate, a training procedure must first be initiated. The system inspection capabilities hinge on a three dimensional lookup table 34 of FIG. 1 which represents RGB space.

Figure 3A:
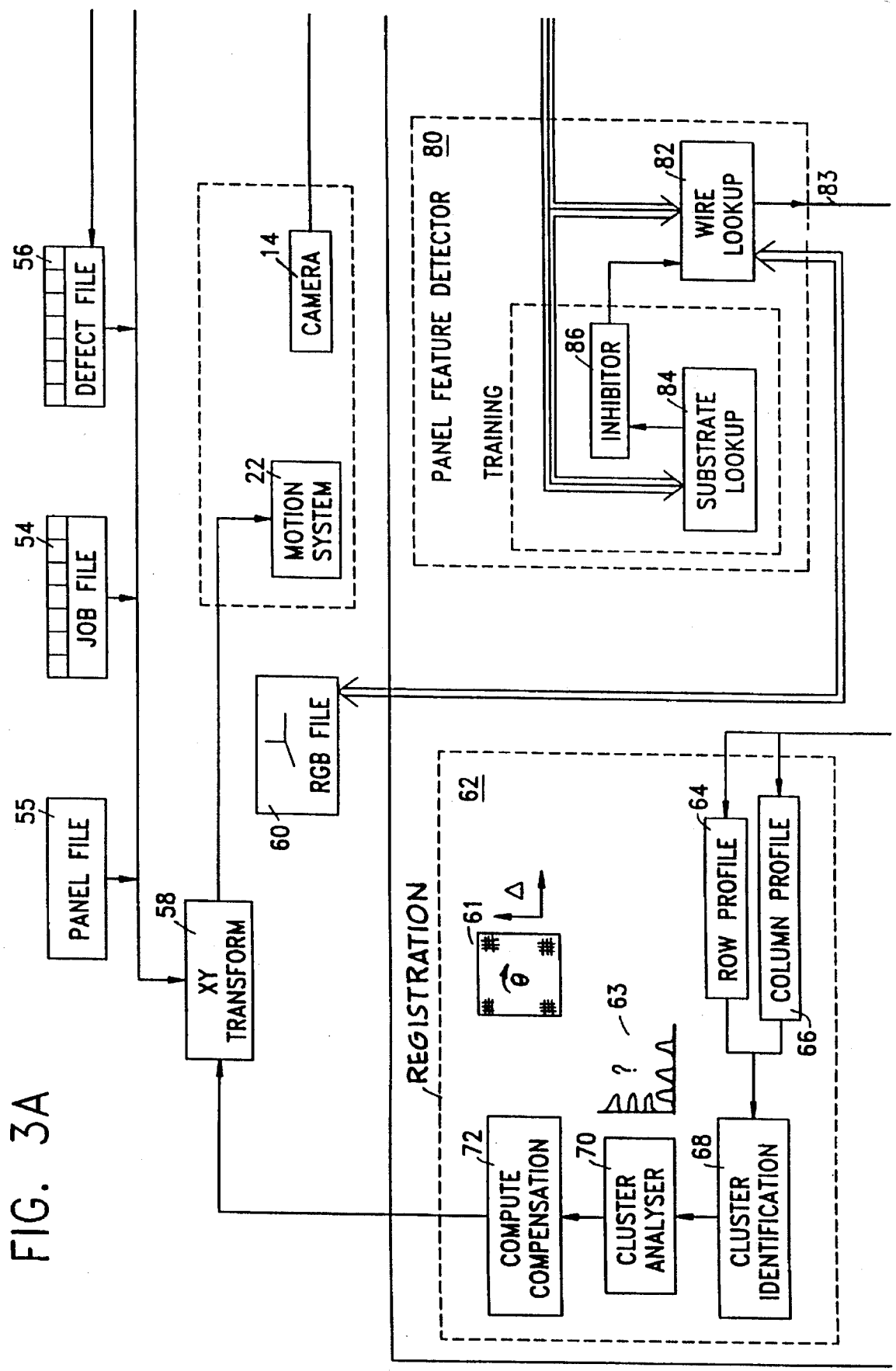
Figure 3B:
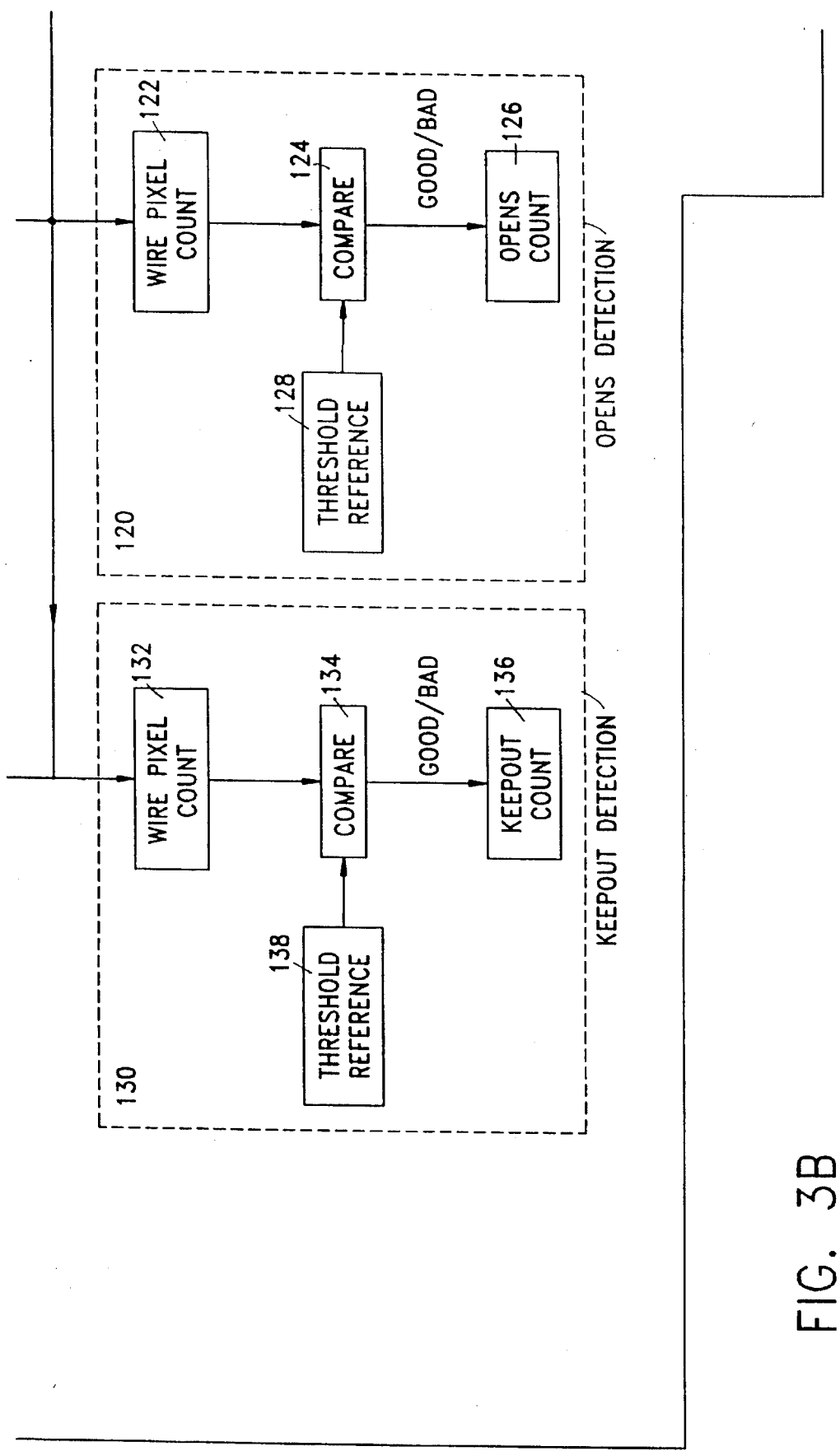
Figure 3C:
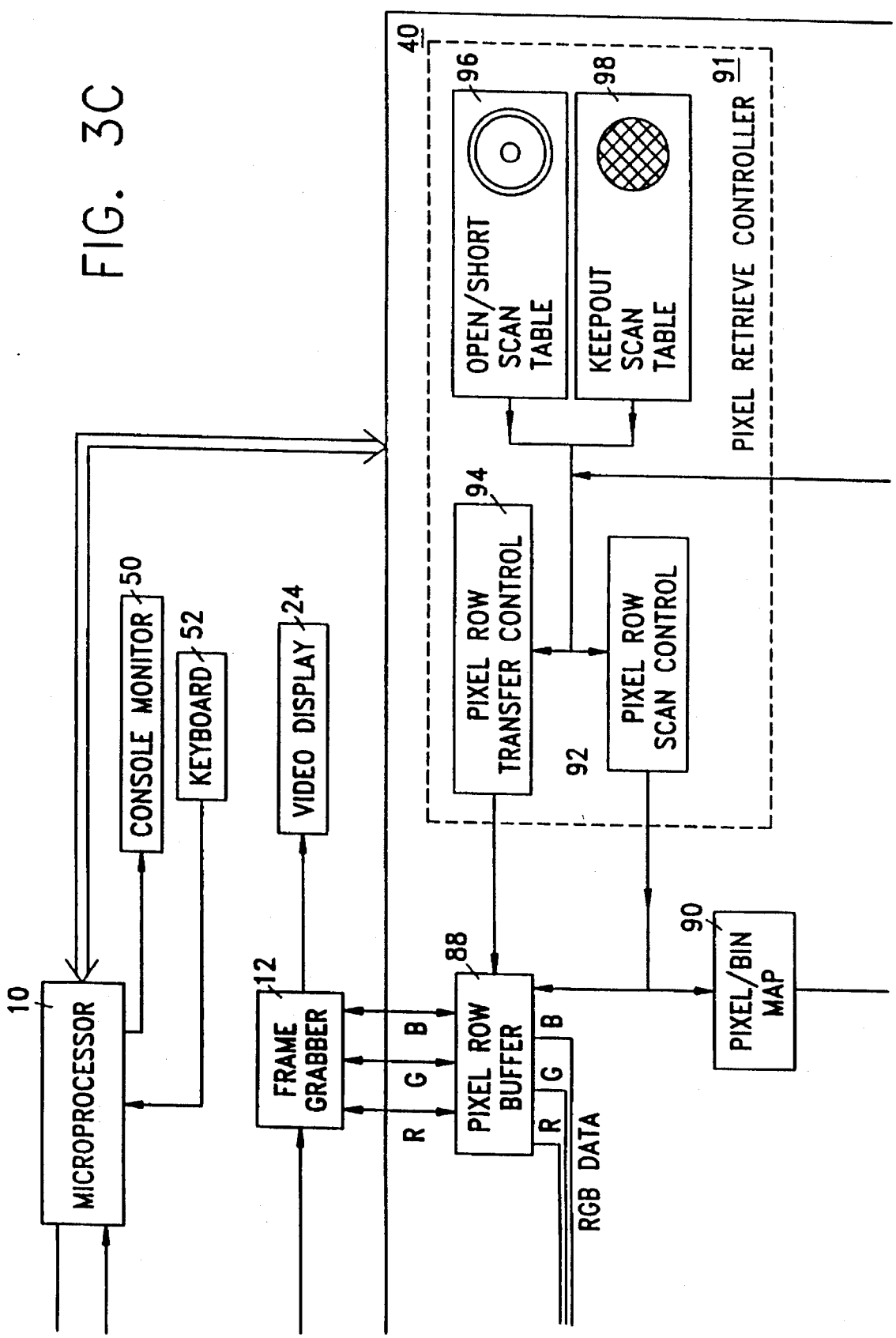

Accordingly, FIG. 3 illustrates a functional block diagram of an embodiment of the present invention. As described above and illustrated by FIG. 1, frame grabber 12 receives image information from RGB camera 14.

Microprocessor 10 is coupled to a console monitor 50 and a keyboard 52. Thus, an interface between an operator inspecting a board and the system may be provided by utilizing the keyboard and a menu displayed on monitor 50. Microprocessor 10 also monitors and controls an analyzer 40. As it will be appreciated by those skilled in the art, analyzer 40 may be implemented either in hardware or software.

Analyzer 40 includes various subsystems for determining the status of wires at hole sites 30.

Panel Feature Detector

One subsystem of analyzer 40 is a panel feature detector 80. The panel feature detector is capable of determining whether a pixel provided by frame grabber 12 corresponds to a wire or substrate of panel 18 under inspection. Panel feature detector 80 includes a wire lookup table 82, a substrate lookup table 84 and an inhibitor 86. Both wire lookup table 82 and substrate lookup table 84 are addressed by a large fraction of the Red ("R"), Green ("G"), and Blue ("B") values of pixels provided by frame grabber 12.

Thus, look-up tables 82 and 84 are a representation of a three dimensional "R" "G" "B" space.

Figure 4A:
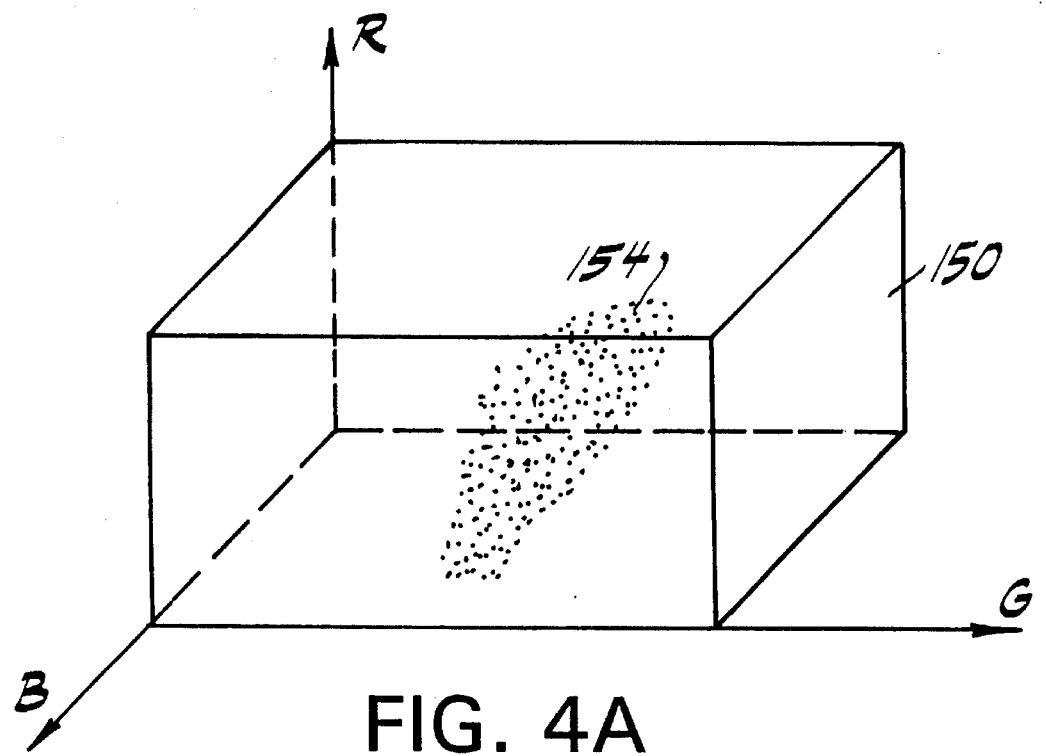
FIGS. 4A and 4B represent an example of a three dimensional RGB space for wire and substrate, respectively.
Figure 4B:
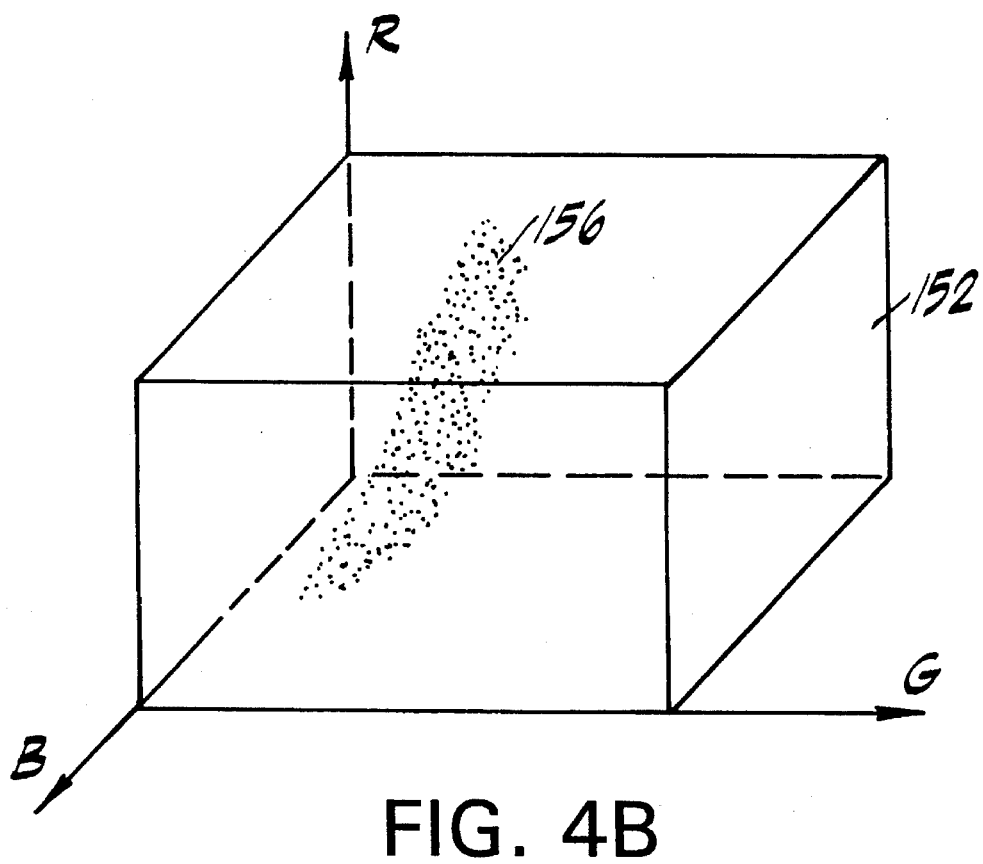

FIGS. 4A and 4B represent an example of a three dimensional RGB space 150 and 152 for wire and substrate, respectively. Thus, the wire bit distribution 154 in FIG. 4A represents points in RGB space which correspond to wire feature, and the substrate bit distribution 156 in FIG. 4B represents points in RGB space which correspond to substrate features. Therefore, all the RGB values that belong to a substrate feature will address a zero bit in the wire RGB space 150 and all the RGB values that belong to a wire feature address a zero bit in the substrate RGB space 152.

Accordingly, every combination of RGB values would refer to a spot in the wire or substrate RGB space. The wire and substrate lookup tables could then be addressed by an "R" and a "G" and a "B" value and the corresponding data can be set to "1" or "0" depending on whether the RGB value belongs to wire or substrate. However, a "1" or a "0" may occupy eight bits in a conventional computer or microprocessor environment. In one embodiment of the present invention, the wire and substrate lookup tables have been set up such that a "1" or a "0" value may occupy one bit only.

FIG. 5 illustrates the structure of wire and substrate lookup tables 82 and 84 according to one embodiment of the present invention. Each dimension of the table corresponding to Red, Green or Blue colors has a resolution of 6 bits, for a total table size of 262144 bits. This translates into 32768 bytes. Since the raw data available from frame grabber 12 is provided at eight bits per RGB component, this represent a four-fold compression in each dimension. Six bits per dimension, however, has proven to be a satisfactory balance between dynamic range and memory conservation.

Table 160 in FIG. 5 corresponds to tables 82 or 84 of FIG. 3. Every consecutive 8 bytes span the limits of the blue axis. Each byte contains eight bits, subdividing the blue axis into a total of 64 discrete increments. The green axis also has 64 increments. Adjacent increments along the green axis correspond to addresses eight bytes apart in the lookup table. The red axis also has 64 increments. Adjacent increments along the red axis correspond to addresses 512 bytes apart (8*64=512) in the lookup table.

Consequently, once an RGB value is provided by frame grabber 12, the R and G and B components may be fused into one 18 bit binary number. The six most significant bits correspond to a Red value and the second six most significant bits correspond to a Green value. The six least significant bits correspond to a Blue value. Thereafter the three least significant bits correspond to Blue value are then stripped and the remaining 15 bits provide a byte address. Each bit in the addressed byte may further be addressed by the three least significant bits which were stripped. Therefore, any bit in the lookup table can be addressed and set to "1" or "0" accordingly. For example, assuming that a wire feature has R=0 G=0 and B=27 or (011,011), the bit corresponding to location 162 in table 160 would be set to "1" if table 160 was a wire lookup table. The three most significant bits of Blue value contribute to a byte address, and the three least significant bits of Blue value, point to a bit location in that byte.

It is then possible to fill up the tables 82 and 84 by setting appropriate bits to a "1" corresponding to an RGB value derived from wire or substrate.

Inhibitor 86 in FIG. 3 monitors RGB values that have a set bit in both the wire and substrate lookup table and sets the corresponding bit in the wire lookup table 82 back to zero. Thus, any RGB values that are in both the wire and substrate lookup tables 82 and 84 are interpreted as substrate.

In a preferred embodiment of the present invention, frame grabber 12 in FIG. 3 provides data on a row by row basis to pixel row buffer 88. The pixel row buffer retains information of all pixels contained in a row and provides this information to panel feature detector 80 on a pixel by pixel basis.

Therefore, the input of panel feature detector 80 is an RGB value corresponding to a pixel in a row of pixels provided by pixel row buffer 88, and the output of panel feature detector 80 is a bit at line 83 provided by the wire lookup table 82 indicating whether the pixel corresponds to a wire or not.

Pixel Retrieve Controller

FIG. 3 illustrates pixel retrieve controller 91. The pixel retrieve controller includes an open/short scan table 96, and a keepout scan table 98. The outputs from open/short scan table 96 and keepout scan table 98 are both coupled to a pixel row transfer controller 94 and a pixel row scan controller 92.

The data stored in the open/short scan table 96 is based on the system's short and open detection criteria at hole sites and the data stored in the keepout scan table 98 is based on the criteria that some hole sites should remain without any wire crossings.

It can be appreciated by those skilled in the art that the frame grabber 12 may store the image of a hole site 30 of FIG. 2. The data stored in tables 96 and 98 is explained more in detail in conjunction with FIG. 6.

Figures 6A, 6B:
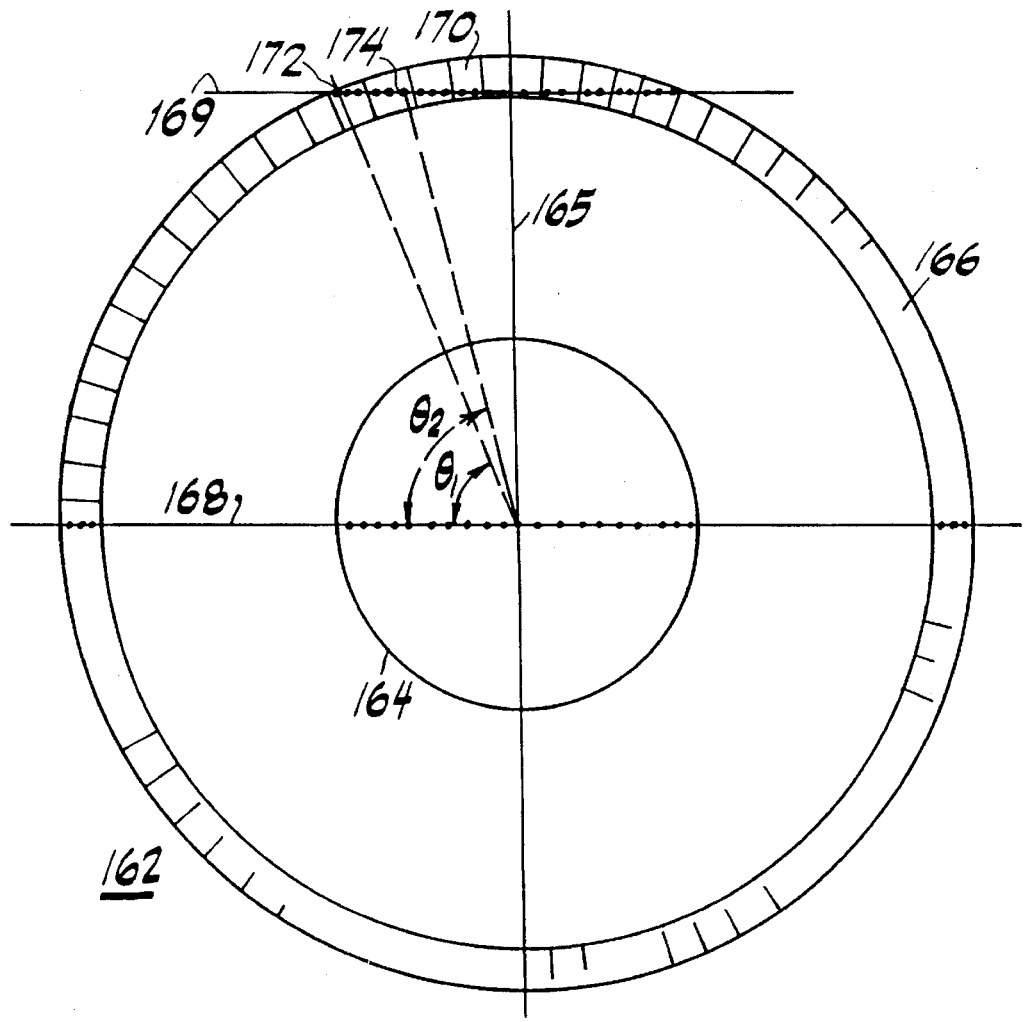
FIG. 6A represents an image with a small open-circuit reticle and a large short circuit reticle imposed on a hole site.
FIG. 6B illustrates an example of the contents stored in the open/short scan table.

FIG. 6A represents a hole site image 162, with a small open-circuit reticle 164 and a large short circuit reticle 166 which is an annular ring imposed on the hole site image. It can be appreciated by those skilled in the art that the short circuit reticle and the open circuit reticle may be actually displayed on the video monitor at the location of a hole site. Short circuit detection is based on three geometric rules. The rules are applied to the short circuit annular ring 166 which has an inner diameter slightly larger than the diameter of holes at inspection sites. The geometric rules are: (a) wires always cross the ring orthogonally; (b) the arc length of any wire crossing is bound by an upper limit; and (c) the ring may be crossed no more than a predetermined number of times. In a preferred embodiment the number of allowed crossings is limited to two.

The open circuit detection ring 164 is substantially a circular region at the center of a hole site being inspected. Open circuit detection discovers a violation when insufficient wire is found within the open circuit detection ring 164.

The inner diameter of the short circuit reticle 166 can change for each new hole size. The width of the short circuit reticle 166 varies slightly depending on the inner diameter of the short circuit reticle 166.

The open/short scan table stores for each row the number of pixels from a vertical diameter 165 to the outer and inner circles formed by short circuit reticle 166. The open/short scan table also stores for each row the number of pixels from the vertical diameter to the circle formed by open circuit reticle 164.

Thus, for example, for a scan line 168, the open/short scan table stores the number of pixels from the center of the ring to the outer circle of the short detection annular ring, and the number of pixels from the center of the ring to the inner circle of the short detection annular ring and the number of pixels from the center of the ring to the diameter of the open detection ring 164. The number of open/short scan lines depends on the inner diameter of the short detection annular ring. Generally, the larger the annular ring, the open/short scan lines are farther apart in order to keep the number of scan lines from getting too large.

FIG. 6B illustrates an example of the contents stored in the open/short scan table 96 of FIG. 3. Thus, for one particular hole site, for each open/short scan line number, there are three corresponding distance parameters in pixel units. For example, for scan line 168, which is the center-most scan line, during inspection the outer bound of short detection reticle is 180 pixels, the inner bound of short detection reticle is 170 pixels and the bound of open detection reticle is 50 pixels. Similarly, for scan line number three (3) which is three scan lines away from center-most scan line, the outer bound of short detection reticle is 172 pixels, the inner bound of short detection reticle is 160 pixels and the bound of open detection reticle is 42 pixels. Table 96 contains only the open/short scan line numbers that are required to be analyzed. There may be more than one open/short scan table for a system with hole diameters of various sizes, since the scan line parameters for each hole site are likely to be different.

The open/short scan line information is provided to pixel row scan controller 92 and pixel row transfer controller 94. Pixel row transfer controller 94 receives the parameters of the next scan line to be analyzed from open/short scan table 96. Pixel row transfer controller 94 then sends the correct number of pixels in the desired scan line to pixel row buffer 88 so that the desired scan line can be retrieved from frame grabber 12.

Pixel row scan controller 92 receives the pixel boundary information of the short and open circuit reticles from open/short scan table 96 and based on that information, sends a control signal to pixel row buffer 88. Consequently, pixel row buffer 88 sends the corresponding pixel information to wire lookup table 82 on a pixel by pixel basis. The control information provided by pixel row scan controller 92 is basically the address of next pixel to be analyzed in a particular row and column number. The row number being the scan line number and the column number being the number of the pixel to be analyzed in that row.

Pixel row scan controller 92 also provides the pixel row and column number to a pixel/bin map 90. The operation of pixel/bin map 90 is explained in more detail in conjunction with FIG. 6A. It can be appreciated by those skilled in the art that the addresses of pixels in the open and short circuit reticles may be stored individually and subsequently color information corresponding to the pixels can be sent to panel feature detector 80 based on the addresses of individual pertinent pixels without resort to pixel row buffer 88.

As illustrated in FIG. 6A, the short circuit reticle is divided into many sections or bins 170. According to one embodiment of the invention, the short circuit reticle is divided into 256 bins. Each bin 170 has an assigned bin number. The pixel/bin map 90 of FIG. 3 stores the assigned bin number of each corresponding pixel in the short circuit reticle 166.

FIG. 7 illustrates an example of pixel/bin map 90. Accordingly, for each type of hole site, particular open/short reticle dimensions are utilized by the system. Once the appropriate open/short reticle information is loaded in the open/short scan table 96, the data in pixel/bin map 90 will be set also. It can be appreciated by referring to FIG. 6A that the pixels contained in each scan line may fall into more than one bin in the short reticle 166. As the scan lines move further away from the center-most scan line 168, the number of bins corresponding to the pixels on the same scan line increases.

FIG. 6A illustrates one example for determining the bin number assigned to pixels 172 and 174. Accordingly, the scan line number corresponding to scan line 169 and the column number corresponding to pixel 172 is derived as the X and Y coordinates of pixel 172. Based on that information, angle $\Theta_1$ corresponding to pixel 172, is measured by calculating the arc tangent (y/x). Similarly, angle $\Theta_2$ corresponding to pixel 174 is measured. The corresponding bin number is determined as follows:

$$\text{Bin number} = \frac{\Theta \times 256}{360}$$

The bin number is scaled to eight bit numbers and is stored as bytes $X_1, X_2, \ldots X_n$ in pixel/bin map 90 of FIG. 7.

It can be appreciated by those skilled in the art that the memory arrangement for open/short reticles and pixel/bin conversion may be performed in various ways. For example, the open/short scan table 96 can store parameters corresponding to every scan line present in frame grabber 12 of FIG. 3. Similarly, pixel/bin map 90 may contain bin numbers assigned to each pixel in every scan line. In that event, when certain scan lines are skipped during analysis of only the pertinent scan lines associated with a particular hole type, then a pointer table indicates the location in pixel/bin map where each new scan line begins.

Shorts Detector

As illustrated in FIG. 3, the bin number assigned to each pixel to be analyzed is sent to short detector 100.

Short detector 100 includes a bin histogram memory 102. Bin histogram memory 102 also receives a signal from wire lookup table 82 on line 83. Thus, for each pixel to be analyzed, bin histogram memory receives the bin number assigned to that pixel from pixel/bin map 90 and receives a signal indicating whether that pixel represents a wire or not from wire lookup table 82. Thus, after analyzing all the pixels of a hole site, a bin histogram of wire class pixels is formed in bin histogram memory 102. For each wire crossing a hole site, there is going to be a peak over a few adjacent corresponding bins in the bin histogram memory. A violation may thus be detected when the majority of pixels in the bin histogram cannot be attributed to at most two peaks.

It can be appreciated by those skilled in the art that the important data in bin histogram memory 102 may be obscured due to various system noise. Thus, the data in the bin histogram memory 102 may be further processed to alleviate the effects of system noise.

Accordingly, a digital filter 104 receives bin histogram data from bin histogram memory 102. To a first approximation, the wire class pixels associated with a wire crossing at the short detection reticle form a triangular distribution as a function of angular position.

Digital filter 104 is a moving window averaging filter and its general response is defined by equation (1) below:

$$R_k = \frac{\sum_{i=1}^{w/2} S_{k+i-w/2-1} + \sum_{i=1}^{w/2} S_{k-i+w/2+1} + S_k}{D} \quad (1)$$

where S is the input signal; R is the output response of filter 104; W is the window width and D is a divisor. According to one embodiment of the present invention digital filter 104 is defined as equation (2):

$$R_k = \frac{\sum_{i=1}^{2} S_{k+i-3} + \sum_{i=1}^{2} S_{k-i+3} + S_k}{5} \quad (2)$$

The output of filter 104 is then provided to a processed histogram memory 106 which will contain a smoothened version of the histogram formed in bin histogram memory 102.

In order to detect the center of each wire crossing, the data contained in processed histogram memory 106 is provided to a digital filter 107. The center of each wire crossing is necessary information for determining whether multiple wire crossings have occurred too close together, violating design rules, and whether actual crossing positions deviate sufficiently from expected crossing positions to violate reference rules. A wire crossing center is considered to be the location wherein the wire class pixel density after smoothing reaches a maximum.

Sometimes, however, wire crossings create double-cusped peaks. In such cases, the peak center could be identified as either one of the cusps, rather than the small valley in between. Digital filter 107 is designed to prevent this type of error.

Digital filter 107 is a peak enhancement filter. Its response is proportional to signal amplitude, and favors triangular peaks. The general response of filter 107 is defined by equation (3) as follows:

$$R_k = \sum_{i=1}^{w/2} i \times S_{k+i-w/2-1} + \sum_{i=1}^{w/2} i \times S_{k-i+w/2+1} + (w/2+1)S_k \quad (3)$$

where S is the input signal provided by memory 106, R is the output response and W is the window width.

According to one embodiment of the present invention, filter parameters defined by equation (4) are as follows:

$$R_k = \sum_{i=1}^{7} i \times S_{k+i-8} + \sum_{i=1}^{7} i \times S_{k-i+8} + 8 \times S_k \quad (4)$$

the coefficients for this filter are: 1, 2, 3, 4, 5, 6, 7, 8, 7, 6, 5, 4, 3, 2, 1.

FIGS. 8A and 8B illustrate diagrams of the processed histogram provided by processed histogram memory 106.

The output of digital filter 107 is coupled to a cluster identifier 108. The cluster identifier determines the bin numbers corresponding to the centers of the two highest distributions assumed to be wire crossing.

Accordingly, the cluster identifier 106 provides the bin numbers corresponding to the center of each of the two peaks 248 and 250 of FIGS. 8A and 8B to cluster analyzer 110. Cluster analyzer 110 also receives data from processed histogram memory 106.

Figure 9:
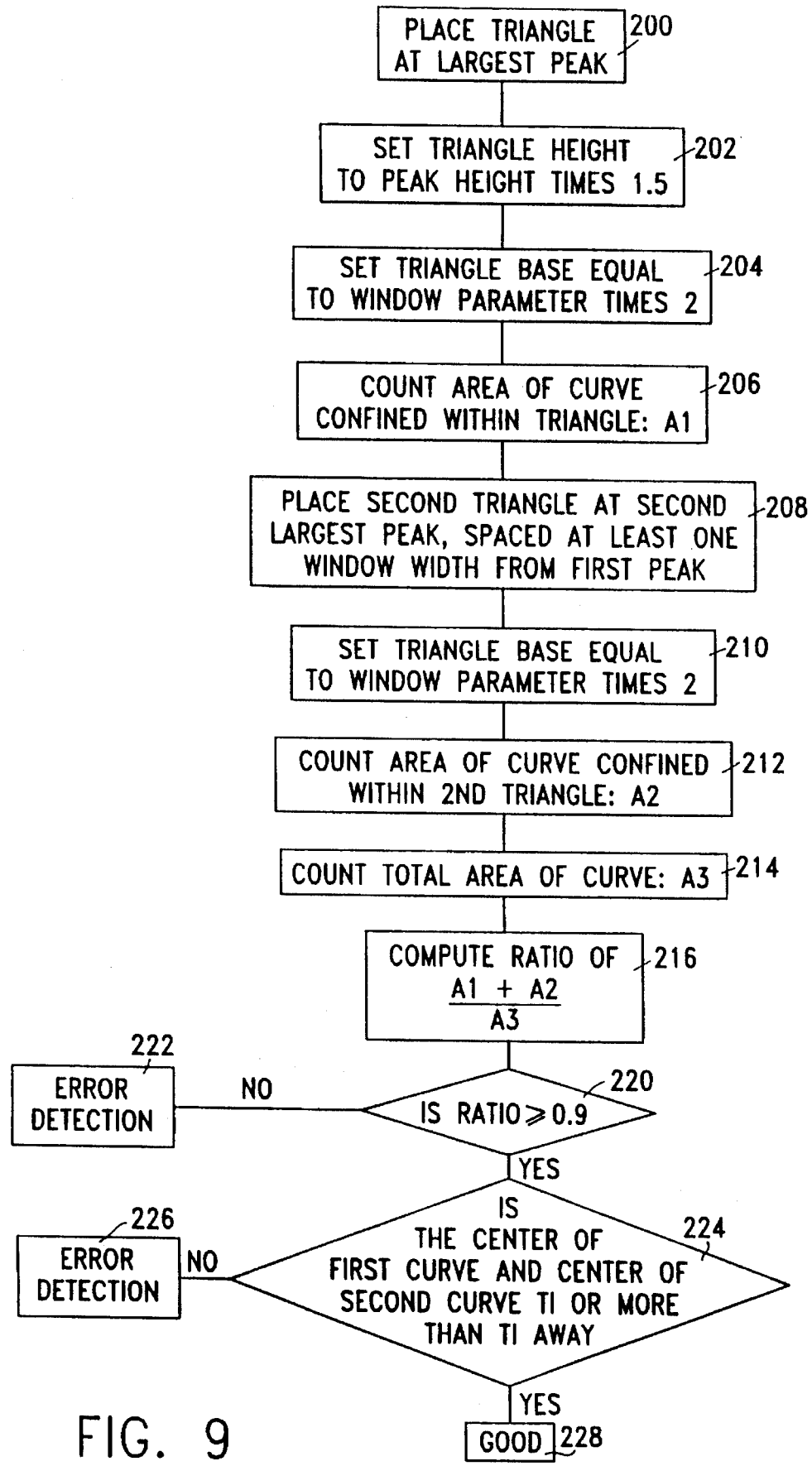
FIG. 9 illustrates a flow chart of operations of cluster analyzer 110.

FIG. 9 illustrates a flow chart of operations of cluster analyzer 110. Accordingly, at step 200 cluster analyzer 110 places a triangle 242 at curve 240 having the largest peak in the processed histogram received from the processed histogram memory 106. Thereafter, at step 202, the triangle 242 with a height "H1" is set to 1.5 times the peak height "P1". At step 204, the triangle base is set to 2 times the window parameter. The window parameter is used to control the size of the triangle 242 base and the filter 107 windows. A default value of 15 (bins) has been found to be most appropriate to date. Consequently, at step 206 the, area A1 of curve 240 confined within triangle 242 is measured by counting the wire-pixels in that area.

At step 208, cluster analyzer 110 places a triangle 246 at curve 244 having the second largest peak in the processed histogram received from the processed histogram memory 106. Thereafter, at step 210, a triangle 246 with a height H2 is placed over curve 244, spaced at least one window width apart from the location 248 of the first peak. Height H2 of triangle 246 is set to 1.5 times the peak height P2.

At step 212, the area A2 of curve 244 confined within triangle 246 is measured by counting the wire-pixels in that area.

At step 214, cluster analyzer 110 measures the total area A3 of the entire processed histogram 239 by counting all the pixels in all of the histogram bins.

At step 216, the ratio of pixels in area A1 and area A2 over the total number of pixels in area A3 is determined.

At decision step 220, the cluster analyzer 110 determines whether the ratio measured at step 216 is equal to or larger than 0.9. If not, the cluster analyzer goes to step 222 and sets an "ERROR" flag. If, however, the ratio measured at step 216 is equal to or larger than 0.9, the system goes to decision step 224, since the majority of the pixel counts in the bin histogram memory has been attributed to at most two peaks.

At decision step 224, cluster analyzer 110 determines the distance between the first peak H1 and second peak H2 and converts that distance to a degree angle. If the degree angle between two peaks is more than a threshold, the system goes to step 228 to set a "GOOD" flag. In one embodiment of the invention, the threshold is 22° If not, the system goes to step 226 to set an "ERROR" flag. Also, the two peak positions are compared with reference positions and if the discrepancy is too great, the system generates an error. In a preferred embodiment 45° is an appropriate good/bad threshold.

Open Detector

FIG. 3 illustrates open detector 120. Open detector 120 determines whether an open circuit will occur at a hole site when the hole is actually drilled. Open detector 120 includes a wire pixel counter 122. The wire pixel counter receives wire pixel counts from wire lookup table 82 on line 83. Wire pixel counter 122 receives pixel counts associated with wire pixels present in open circuit reticle 164 of FIG. 6A.

Therefore, the pixel row scan controller 92 and pixel row transfer controller 94 receive from open/short scan table 96 the pixel numbers present on a scan line and confined within the open circuit reticle 164. Thus, the pixels to be analyzed are transferred to pixel row buffer 88. Once a pixel being analyzed is attributed to wire, the wire pixel counter 122 increases one count. It can be appreciated by those skilled in the art that the pixels for opens detection may be derived from a single row transfer which serves open and short detection.

After completion of all scan lines having pixels within the open circuit reticle, the wire pixel count is sent to a comparator 124. Comparator 124 receives a threshold reference from threshold reference memory 128 and compares the number of wire-pixel counts to threshold reference. If the number of wire-pixel counts is below the threshold reference, the comparator sends an "ERROR" flag to opens counter 126.

Keep Out Detector

FIG. 3 also illustrates keepout detector 130. Keepout detector 130 determines whether there are any illegal wire crossings at an unwired hole site. Similar to open detector 120, keepout detector 130 includes a wire pixel counter 132, providing the wire pixel count of a keepout reticle to a comparator 134. Comparator 134 then compares the wire pixel count provided by wire pixel counter 132 with a threshold reference stored in threshold reference memory 138. If the wire-pixel count is above the threshold reference, the comparator sends an "ERROR" flag to keepout counter 136.

Keepout detector 130 receives wire pixel count triggers from wire lookup table 82 on line 83. The location of pixels to be analyzed for keepout detection are stored and provided by keepout scan table 98. Keepout scan table 98 provides the scan line number and the number of pixels on each scan line in keep out reticle. The information is then utilized by pixel row transfer control 94 and pixel row scan control 92 to send appropriate pixels to wire lookup table 82, and consequently, wire pixel counts to wire pixel counter 132.

Registration Controller

Figure 2B:
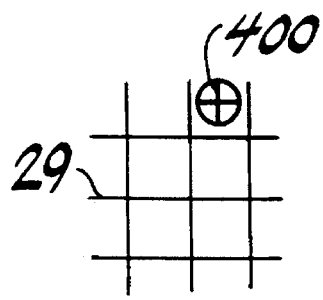
FIGS. 2B and 2C illustrate a registration coupon as shown on a video monitor.
Figure 2C:
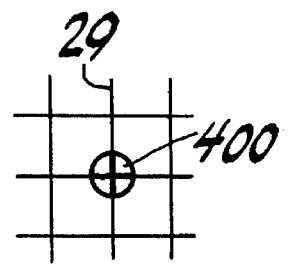

FIG. 3 also illustrates the registration controller 62. Each panel for inspection has four registration coupons one on each corner of the panel. Each position on the panel 18 which needs to be inspected is addressed by X and Y coordinates. Thus, if the panel on the X-Y table 16 is not aligned accurately, the system would not be able to determine a desired position on the panel. Furthermore, due to various reasons, panel 18 may become distorted to an extent that even if it is aligned precisely on X-Y table, due to distortions, the system would be unable to determine a desired position on the panel. The registration controller according to an embodiment of the present invention compensates for such misalignment or distortions. To measure the alignment error and dimensional distortion of a panel, the registration controller determines the position of the four registration coupons. FIGS. 2B and 2C illustrate registration coupons 29 on panel 18. Accordingly, each registration coupon has three vertical and horizontal wires.

Registration controller 62 in FIG. 3 includes a row profile buffer 64 and a column profile buffer 66, each receiving wire-pixel counts from wire lookup table 82 on line 83. Each element of the row profile buffer provides the sum of wire pixels found in a particular row of an image. Each element of the column profile buffer provides the sum of wire pixels found in a particular column of an image. The information from row profile buffer 64 and column profile buffer 66 is provided to a cluster identifier 68. Cluster identifier 68 locates all clusters corresponding to wires in the row and column profile.

If three clusters were found in each buffer, the information derived in cluster identifier 68 is then provided to cluster analyzer 70. At cluster analyzer 70, the center of the three clusters in the row profile and the center of the three clusters in the column profile are determined (see diagram 63 of FIG. 3). Thus, the x, y coordinates of the center of each registration coupon can be obtained.

The x, y coordinates of the center of each registration coupon is then sent to a compensator 72. Compensator 72 compares the actual x, y coordinates of registration coupons with the reference x, y coordinates of registration coupons of an ideal panel. Thereafter, the compensator 72 provides the offset value of x, y coordinates for the panel under inspection, corresponding to where the registration coupons on the panel are and where they should be. The offset value includes a translation and a rotation (see diagram 61 of FIG. 3).

An x, y transformer 58 is coupled to compensator 72. The x,y transformer provides a transformation matrix between the ideal positions of hole sites to be inspected and actual position of those hole sites on the panel.

Job File

FIGS. 3 and 10A–10B also illustrate a job file 54 which contains pertinent information on all the hole sites to be inspected on a panel. The first field H of job file 54 designates a hole code 250 based on the size of the hole.

Hole code 250 is a pointer to another record 280 of FIG. 10B having six fields, 266–276. The six fields, 266–276, designate the reticle sizes associated with each hole code. The first three fields, 266–270, contain reticle information used during automatic inspection. The first three fields reticles define an open circuit reticle 266, short circuit reticle 268, and keepout reticle 270. The remaining three fields are the reticles used during defect review, and are chosen in accordance with accept/reject criteria used during defect review.

The remaining fields of the job file include fields 252 and 254 which represent the x, y coordinates of each hole site to be inspected. Fields 256 and 258 represent the entry and exit vectors of each wire crossing a hole site.

Figure 10C:
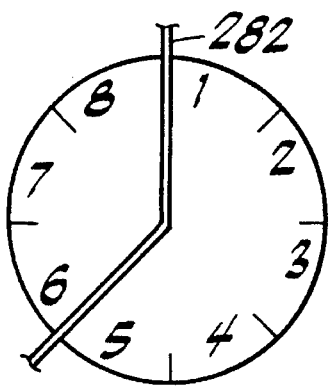
FIG. 10C illustrates an example of entry and exit points at a hole site.

FIG. 10C illustrates an example of entry and exit vectors at a hole site. Accordingly, each hole site is divided into a few sections. Thus, for example, wire 282 in FIG. 10C enters the hole site along vector 1, Ventry=1, and exits the hole site along vector 6, Vexit=6.

The remaining three fields, 260–264, of FIG. 10A provide the defect status information for the inspected holes. Accordingly, field 260 is set when a violation after keepout reticle scan is encountered. Similarly, fields 262 and 264 are set when violations after short/open reticle scan are encountered.

As mentioned before, motion system controller 22 of FIGS. 3 and 1 provides motion control for X-Y table 16. Motion system controller 22 receives compensated X, Y coordinates from X-Y transformer 58 of FIG. 3. It can be appreciated by those skilled in the art that whenever a desired hole site needs to be inspected, the X, Y coordinates in fields 252 and 254 of job file 54 are provided to XY transformer 58 so that the actual hole site location on the panel is obtained.

Neural Network Feature Detector

According to another embodiment of the present invention panel feature detector 80 is substituted by another panel feature detector based on a neural network.

FIG. 11 illustrates a panel feature detector 300. Accordingly, panel feature detector 300 receives RGB information from frame grabber 12 of FIG. 3 as explained before. The output of node 302 indicates whether the RGB values of a pixel correspond to a wire or not.

Panel feature detector 300 is a two hidden-layer fully connected feed forward neural network. The input layer contains three nodes 304, 306 and 308 with linear transfer functions. Nodes 304, 306 and 308 distribute incoming RGB data to the rest of the network. The following layers, including nodes 310–320 and nodes 322–332, have connections which do not appear as inputs or outputs to the real world, and are thus called hidden layers. All layers with the exception of the input layer, have sigmoidal transfer functions. Sigmoidal transfer functions, also known as "squashing functions", map a large input domain, typically negative to positive infinity, into a small output range which can be used in panel feature detector 300 as follows:

$$f(X): \frac{1}{1+e^{-(X)}}$$

In general, a squashing function must be continuous, monotonic and differentiable at all points. In a continuous-valued artificial neural net implementation with output values ranging from 0.0 to 1.0, output values less than 0.5 are normally taken to represent one state such as "false", whereas output values greater than 0.5 are taken to represent a complimentary state such as "true". The farther from 0.5 an output value is, the greater its strength. It is generally desirable to treat a region centered at 0.5 and ranging from 0.4 to 0.6, for example, as a buffer zone between "true" and "false", corresponding to a "no conclusion" state.

Accordingly, the state of node 302 in FIG. 11 indicates wire presence and absence. Furthermore, each node in panel feature detector 300 has a connection to every node in following layers.

Figure 11A:
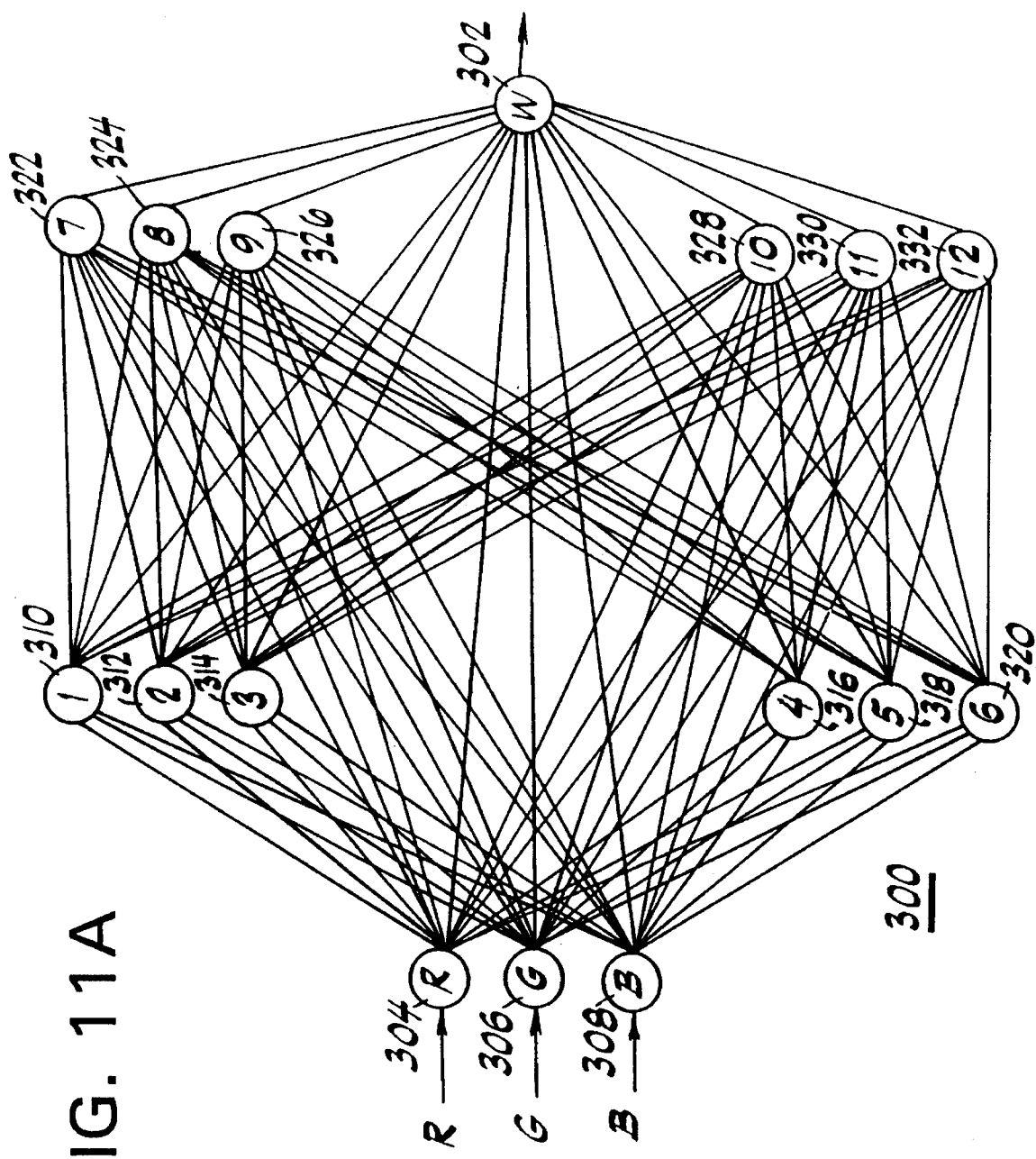
FIGS. 11A and 11B illustrate a panel feature detector according to one embodiment of the present invention.
Figure 11B:
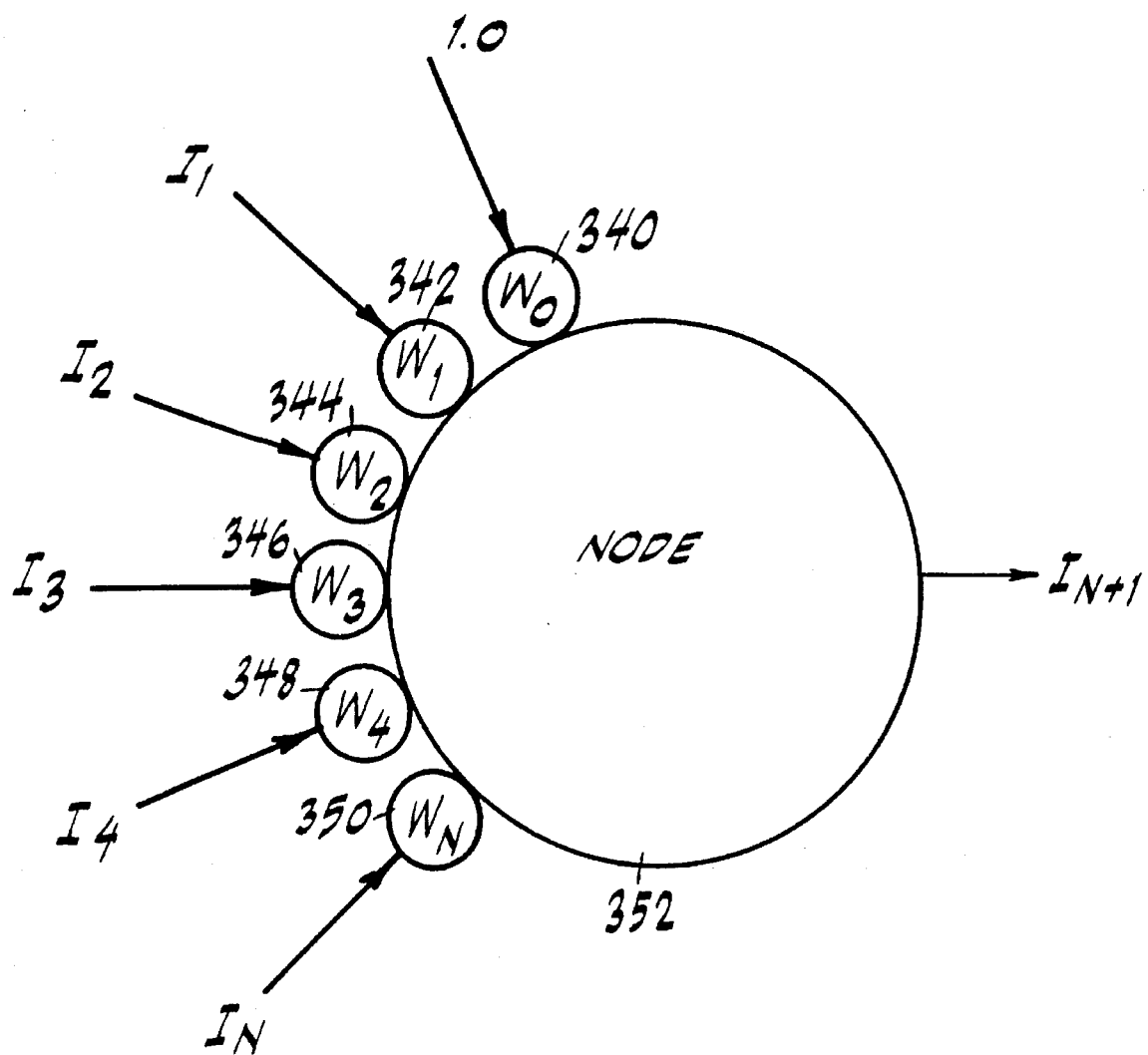

FIG. 11B illustrates a single node which could be any of the nodes illustrated in FIG. 11A. Each node receives input from nodes in the prior layers.

Weighting elements 340–350 govern the influence of each prior node on the subject node 352.

Each node adds up the weighted node values received from prior nodes as follows:

$$A = Wo + \sum_{i=1}^{N} Ii \times Wi$$

wherein A is called activation of a node, Ii is the node value received from other nodes and Wi is the weighting factor providing the extent of influence of the prior nodes on the subject node.

The activation A for each node K is then squashed by the "squashing function" as follows:

$$f(A): \frac{1}{1+e^{-A}}$$

In order to train the neural network of FIG. 11A a back propagation method may be implemented. Accordingly wire pattern may be provided to panel feature detector 300. For a reliable response it is desired that the output of node 302 be 0.9 for wire pixels and 0.1 for substrate pixels.

However during the training mode for example the output of node 302 when initially exposed to wire pixels may be less than 0.9. Consequently an error is generated which is a value between the desired 0.9 output and the actual output of node 302.

Thereafter the input weights to nodes 322–332 and 310–320 and 302 are manipulated such that the value of the output at node 302 gets closer to 0.9. The neural net is also exposed to substrate pixels. The weights of all the nodes in the network may be manipulated so that the value of the output in node 302 gets closer to 0.1, for all substrate pixels. The neural network is exposed to many new wire and substrate pixels and adjusted as necessary until all new pixels are consistently classified correctly.

Once the neural network is trained the system will be ready for inspection mode.

It can be appreciated by those skilled in the art that the neural network need not be implemented as a fully connected network. Accordingly, a partially connected network wherein some of the weighing elements have a zero value may be implemented as well. A zero weighing element causes a node connection to vanish.

Hue Based Feature Detector

Figure 12A:
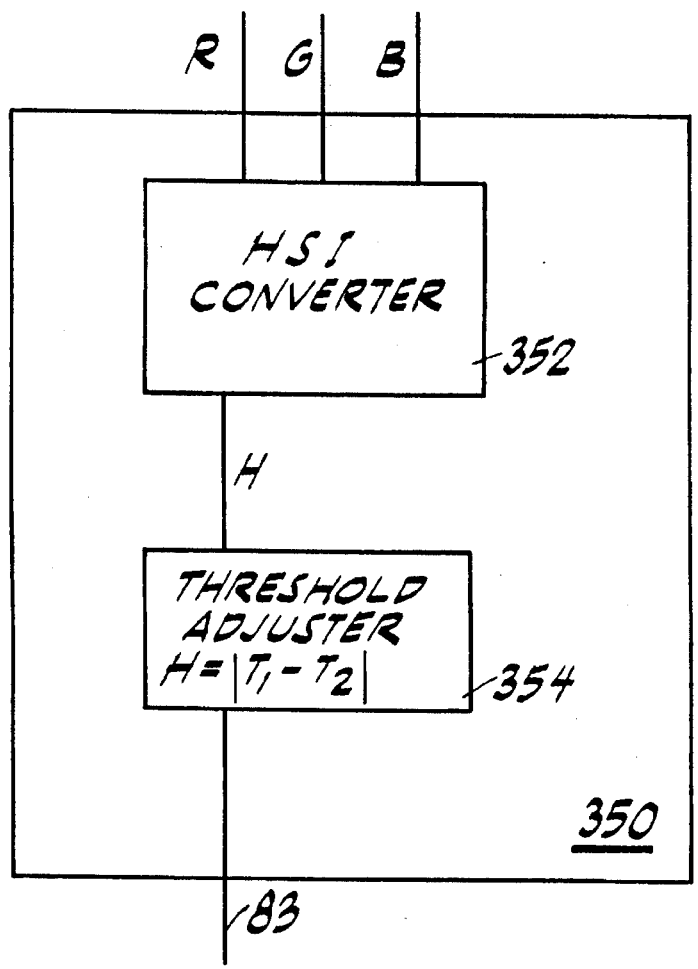
FIG. 12A illustrates another panel feature detector according to one embodiment of the present invention.

A still further embodiment of the present invention is provided by substituting panel feature detector 80 of FIG. 3, with panel feature detection 350 of FIG. 12A.

Panel feature detector 350 receives RGB information from frame grabber 12 of FIG. 3. The panel feature detector 350 includes an RGB to HSI converter 352 which receives the RGB values corresponding to each pixel being analyzed and converts the RGB value into hue, saturation, and intensity values.

Like RGB, an HSI (hue, saturation, intensity) description of a color image uses three components. By using HSI components it is possible to utilize only one component, especially hue to detect the features of a panel.

For HSI applications frame grabber 12 may be a commercially available device that converts RGB components to HSI components like "HSI COLOR FRAME GRABBER", manufactured by DATA TRANSLATION, part number DT-2871.

The H component from HSI converter 352 is then provided to threshold adjuster 354. During training mode threshold adjuster 354 sets upper and lower limit parameters T1 and T2 within which a hue value represents a wire-pixel.

Figure 12B:
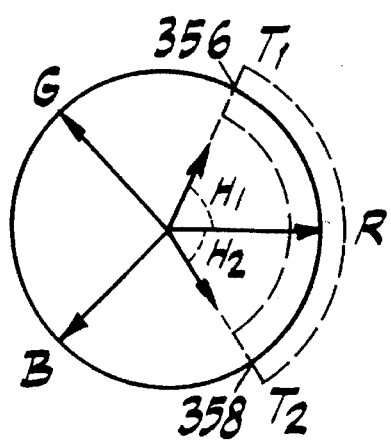
FIGS. 12B and 12C illustrate hue threshold parameters T1 and T2.
Figure 12C:
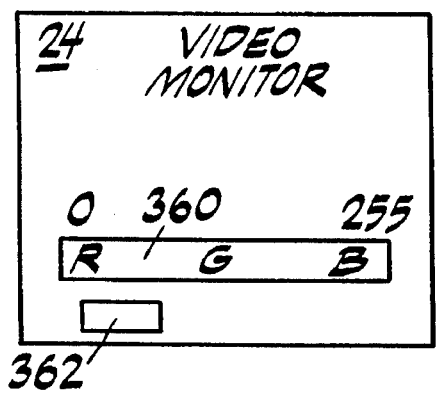

FIGS. 12B and 12C illustrate hue threshold parameters T1 356 and T2 358. Thus for hue values with the range of T1 through T2 in FIG. 12B a wire-pixel is attributed.

In the HSI domain, hue is expressed as an angle between 0 and 360 degrees. Hue is derived by summing the contributions of a Red vector at 0 degrees, a Green vector at 120 degrees, and a Blue vector at 240 degrees.

FIG. 12B illustrates the hue thresholds T1 and T2 in reference to the Red, Green and Blue vectors. Thus the location of and distance between T1 and T2 can be adjusted until a reliable threshold for determining the features of the panel is found.

Operation

The operation of the system according to the present invention includes two separate modes. The first mode is that of training the system so that it can differentiate features on the panel. Specifically, during training mode it is possible to teach the system to differentiate wires from substrate.

As illustrated in FIGS. 1 and 3, a discrete wiring panel 18 is placed on the X-Y table 16 for training the system. It is assumed that at this point the system is not capable of differentiating wire features on panel 18 from the substrate. Console monitor 50 provides a menu of options for the operator's use. Once the discrete wiring panel 18 is placed on the X-Y table 16, the operator may conduct a manual coupon registration. Microprocessor 10 initializes X-Y transformer 58 with zero offset values. Therefore, actual X-Y values are provided to motion system 22 to move X-Y table 16 until a registration coupon appears under RGB camera 14.

Meanwhile the operator may visually trace the movement of the X-Y table on video monitor 24.

FIGS. 2A and 2B illustrates a registration coupon 29 that can be seen on the video monitor 24. A cross-hair 400 is superimposed on the image shown on the video monitor. The cross-hair 400 corresponds to the center of the camera lens to aid the operator in aligning the registration coupon.

Accordingly X-Y table 16 is moved until the center of cross hair 400 falls on the center of registration coupon 29, as in FIG. 2C. Once the operator determines that a registration coupon is aligned, the X,Y coordinates of the center of the registration coupon may then be stored by pressing a button on keyboard 52 of FIG. 3. This operation is repeated until X, Y coordinates of all four registration coupons have been determined. The X-Y coordinates are then provided to compensator 72 of FIG. 3 so 14 that the actual position of registration coupons can be compared with their reference positions stored in panel file 55. A separate panel file 55 is used to describe the coupon arrangements for all the various panel types. Compensator 72 then provides the proper translation matrix to X, Y transformer 58.

Once the panel has been manually registered, the operator may begin the training mode, by pressing another button on the keyboard 52. Microprocessor 10 then superimposes a training rectangle 402, shown in FIG. 1, on the image retrieved by RGB camera 14. The dimension of the training rectangle 402 may be provided algorithmically or by a training rectangle table 93, shown in FIG. 3. According to one embodiment of the present invention the length and width of the training rectangle is 2×2 mils, which encloses a ten by ten pixel area. Training rectangle 402 can be superimposed over any desired portion of frame grabber 12. Video monitor 24 displays the image of rectangle 402 moving over displayed image.

The operator then moves the training rectangle 402 such that it encloses a piece of a substrate scene. When this is accomplished, the operator instructs the system to sample the RGB values within this training rectangle 402.

Upon receiving "sample" instruction, microprocessor 10 provides a signal to frame grabber 12 to freeze the image being retrieved by RGB Camera 14. Training rectangle table 93 provides the information necessary to retrieve the pixels enclosed in the training rectangle area to pixel row buffer 88. Since the RGB values retrieved correspond to a substrate region, only the bits in the substrate look-up table associated with the RGB values will be set to "1". Since the digitized video signals contain a significant amount of noise, it is advantageous to sample the pixels within the rectangle a number of times. In one embodiment of the present invention, each time the operator initiates data sampling, all pixels in the rectangle are sampled twenty times. This produces two thousand samples per operator action. As a result, the relevant regions of the look-up table 84 corresponding to the substrate will fill with "ones" quickly. The operator continues to take samples of more substrate scenes. Each time sampling is complete, the areas of the displayed image now known to be substrate according to the substrate look-up table become artificially tinted green. This provides the operator with feedback as to how well the training is progressing. During sampling of the substrate, the operator attempts to capture as many variations as possible. Every nuance of substrate which is captured is then guaranteed not to be mistaken as wire after training. It is also desirable that the light intensity and focus be varied during training. This incorporates light and focus variations into panel feature detector 80.

Thereafter, the operator starts placing scenes of wire in the training rectangle 402 and instructs the system to sample and store the data in the wire look-up table. Again the operator should conduct the training under fluctuating light and focus conditions. Features extraneous to wire are prevented from being incorporated into the wire look-up table 82 by keeping them out of the training rectangle 402. This time all areas of the image on the video monitor 24 with RGB values corresponding to wire look-up table 82, become tinted artificially red each time sampling is complete and all areas corresponding to substrate get tinted green again as well.

Inhibitor 86 of FIG. 3 compares the RGB values in both look-up tables 84 and 82. In the event that an RGB value has set a bit in both substrate look-up table 84 and wire look-up table 82, the bit in the wire look-up table is set back to zero. Accordingly, the RGB value will be interpreted as substrate and the pixel corresponding to the RGB value becomes tinted green.

The recognition accuracy in the end is a function of the diversity of scene characteristics to which the system has been exposed during training. To increase the efficiency of training, the operator has the ability to dilate the substrate look-up table 84 and wire look-up table 82. Under dilation, any bits with value "one" force their immediate neighbors in all three dimensions to become "one" as well. This has the effect of forcing generalization. Image regions which by virtue of lack of artificial tinting are observed to be undefined or dotted with noise, quickly change to a defined state under dilation. Finally, when all regions of additional novel images are strongly and correctly classified, training is complete. The operator instructs the system to store the 32 k byte wire look-up table 82 onto RGB file 60 which in one embodiment is a computer disk.

FIGS. 12A–12C illustrate the training operation of the system when panel feature detector 350 of FIG. 12A is substituted for the panel feature detector 80 in FIG. 3. Accordingly, thresholds 356 and 358 may be determined and set by utilizing video monitor 24 of FIGS. 1 and 3. The circular representation of the RGB vectors of FIG. 12B can be represented by a linear hue spectrum 360 in FIG. 12C. Thus hue values corresponding to RGB vectors can be represented by a number between 0 to 255 on hue spectrum 360.

A white bar 362 is superimposed on the image shown on video monitor 24. The operator can move the white bar 362 side to side along the hue spectrum 360. The operator can also shorten or enlarge the white bar. Thus, the thresholds $T_1$ and $T_2$ on the hue spectrum may be defined.

Consequently all pixel elements having hue values within the boundary defined by white bar 362 are associated with wire and pixel elements having hue values outside the boundary defined by white bar 362 are associated with substrate features.

The training of the neural network feature detector is similarly conducted as explained above.

Once the system is trained, it is capable of inspecting similar wire scribed circuit panels. Accordingly, the operator places a circuit panel 18 to be inspected on X, Y table 16. Microprocessor 10 retrieves the coordinates of registration coupons one at a time from the panel file. The coordinates of the registration coupon are then provided to XY table 16 so that the table is moved such that the vicinity of the registration coupon is placed under RGB camera 14. Once a registration coupon is encountered by the RGB camera, coupon registration 62 is invoked to locate the center of the registration coupon. The coordinates of the located center thus become the actual coordinates which are compared with reference coordinates. Accordingly the motion controller 22 moves the XY table 16 in both X and Y coordinates so that row profile buffer 64 and column profile buffer 66 can receive wire pixel counts corresponding to three horizontal and vertical lines of the registration coupon. Registration 62 finally derives the centers of the coupons and provides the information for the transformation matrix in X Y transformer 58.

Thereafter, inspection of the hole sites begins by retrieving the coordinates of each hole site to be inspected from job file 54. The coordinates of each hole site are then fed to X Y transformer 58 so that the actual hole site on a particular panel being inspected can be located.

Once a hole site is positioned under the RGB camera, open/short scan table 96 and keepout scan table 98 provide corresponding data so that the appropriate pixels for analysis are retrieved and sent to panel feature detector 80. Thereafter short detector 100 determines whether the wire crossings on the hole site boundary are violating any rules explained before. Specifically, short detector 100 determines the number of wire crossings over the hole site boundary and the locations of entry and exit.

Similarly, open detector 120 determines whether the wire is placed accurately enough that a substantial part of it is within the open reticle.

For hole sites where no wire crossings are allowed, the keepout detector determines whether any wire has illegally entered the hole site. The system then analyzes all the hole sites on the wiring panel 18 one at a time. Job file 54 preferably is formed such that the distances travelled in visiting all the points is minimized by applying a point order optimization phase. The optimization is done on a per hole-class basis. When traversing the points in an optimized inspection job file, all points within a given hole class are encountered together. This is because computational overhead is involved when the inspection system adjusts for a new hole code.

As explained before, every time a new hole code is to be utilized pixel/bin map 90 has to be initialized which involves computational overhead. The hole code changes that are required during inspection are therefore intentionally minimized during optimization.

Every time a defect is determined, the information corresponding to the hole site is stored in a defect file 56. Once all the hole sites have been inspected, the system goes to review mode, wherein the operator can visually inspect all hole sites having apparent defects.

The locations of defective hole sites are retrieved from defect file 56 for manual inspection. The operator then determines whether errors flagged by the system are significant or not and whether they can be easily corrected. Thus the task of inspecting many hole sites becomes increasingly reliable and simple.

Figure 13A:
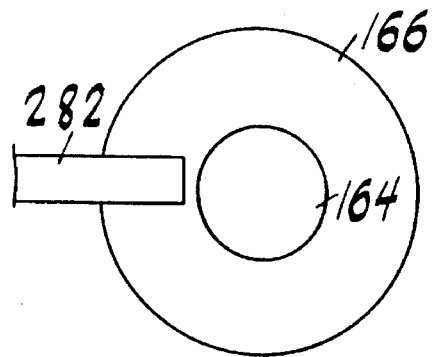
FIGS. 13A–13F illustrate some examples of good and defective wire crossings at hole sites.
Figure 13B:
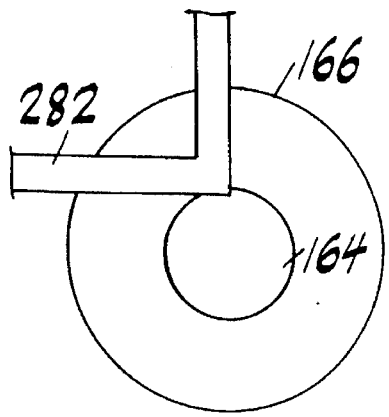
Figure 13C:
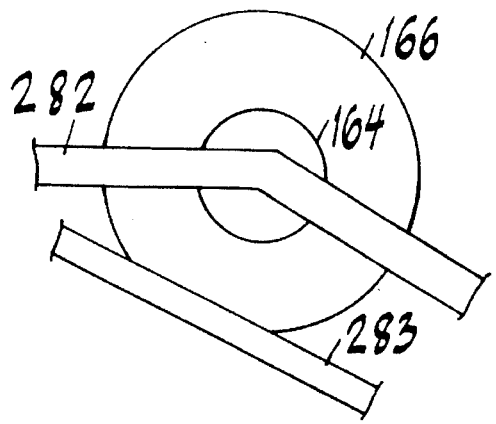
Figure 13D:
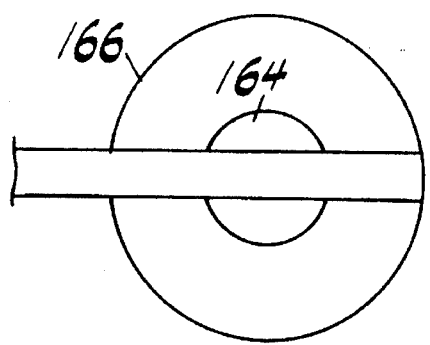
Figure 13E:
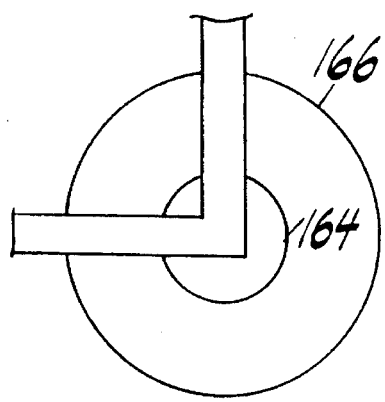
Figure 13F:
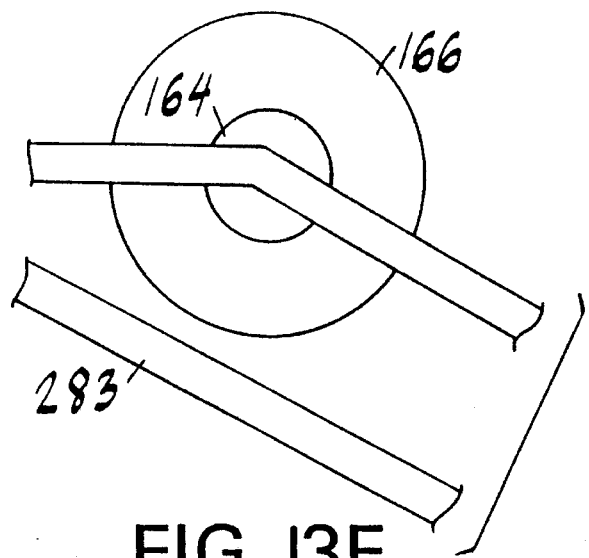

FIGS. 13A–13F illustrate some examples of wire crossings at hole sites. Accordingly, FIG. 13A illustrates a defective wire termination, since wire 282 does not end sufficiently within the open circuit reticle 164. Therefore, it is likely that when the hole site is drilled, an open circuit occurs for lack of connection between wire 282 and the conductive plating to enter the drilled hole site. Conversely, FIG. 13D illustrates a proper wire termination having sufficient mass within the open circuit reticle 164. Similarly, FIGS. 13B and 13E illustrate a defective wire inflection and a desired wire inflection. FIG. 13C illustrates a defective hole site which can lead to a possible short circuit occurrence when the hole is drilled. In the example illustrated by FIG. 13C, the short circuit detection will detect more than two wire crossings due to illegal wire 283 crossing the hole site. FIG. 13F illustrates the desired situation for wire crossings.

It can be appreciated by those skilled in the art that the system according to the present invention may be easily modified to perform inspection of printed circuit boards. Consequently, the system may be trained to differentiate between the conductor traces on the printed circuit board and the substrate over which the conductor traces are disposed. The system of the present invention is particularly advantageous in situations where the light intensity reflected from the conductor trace and the substrate are very similar. Conventional black and white imaging systems as mentioned before become ineffective when the light intensity reflected from the conductor trace is similar to the light intensity reflected from the substrate.

Accordingly, for printed circuit board inspection, appropriate design rules commonly known in the art may be implemented such that conductor traces comply with certain minimum design requirements. For example, threshold tolerances may be set for the width of conductors or the gap between two conductors below which the printed circuit board would not be acceptable.

As illustrated and described above, the invention can be implemented by various embodiments. The invention in its broader aspects is therefore, not limited to the specific embodiments herein shown and described but departures may be made therefrom within the scope of the accompanying claims without departing from the principles of the invention and without sacrificing its chief advantages.

We claim:

1. An optical inspection system for detecting faults at potential hole sites of a wire scribed circuit board having a plurality of wires scribed on a substrate, comprising:

a video camera for receiving images of desired hole sites on said wire scribed circuit board, said video camera converting each image to electrical video signals;

an image storage memory for storing color element values indicative of the chromaticity of a plurality of pixels derived from said electrical video signals;

a panel feature detector receiving said color element values of a pixel to be analyzed from said image storage memory, providing a wire indication when said color element values of said pixel correspond to a wire feature;

a pixel retrieve controller providing command signals to said image storage memory to transmit to said panel feature detector color element values corresponding to predetermined pixels associated with a hole site to be analyzed; and an open detector circuit receiving said wire indication from said panel feature detector corresponding to said predetermined pixels associated with said hole site, said open detector determining whether an open circuit could occur when said hole site is drilled;

wherein said pixel retrieve controller further comprises an open scan table associated with a hole site having a plurality of corresponding scan lines said open scan table for each said scan line storing boundary values for an open circuit region, where said boundary values are used to derive said command signals.

2. The system according to claim 1 further comprising:

a keepout detector circuit receiving said wire indication from said panel feature detector corresponding to said predetermined pixels associated with said hole site, said keepout detector circuit determining whether no wire is crossing said hole site.

3. The system according to claim 2 wherein said pixel retrieve controller further comprises:

a keepout scan table associated with a hole site having a plurality of corresponding scan lines said keepout scan table for each said scan line storing:
the number of pixels from said vertical diameter crossing through said hole site to the circle formed by a keepout reticle.

4. The system according to claim 2 wherein said predetermined pixels correspond to a keepout reticle superimposed on said hole site and said keepout detector further comprises:

a wire pixel counter; and a comparator for determining whether the number of wire pixels detected in said keepout reticle are less than a predetermined threshold.

5. The system according to claim 1 wherein said image storage memory comprises a frame grabber providing data on a scan line basis to a pixel row buffer, said pixel row buffer retaining information of all pixels contained in a scan line and providing said information to paid panel feature detector on a pixel by pixel basis.

6. The system according to claim 1 wherein said boundary values include the number of pixels from said vertical diameter crossing through said hole site to a circle formed by said open circuit region.

7. The system according to claim 1 wherein said predetermined pixels correspond to said open circuit region superimposed on said hole site and said open detector circuit further comprises:

a wire pixel counter; and a comparator for determining whether the number of wire pixels detected in said open circuit region is above a predetermined threshold.

8. The system according to claim 1 wherein said panel feature detector further comprises:

a wire look up table representing a three dimensional RGB space, said wire look up table addressed by a number corresponding to the magnitude of said color element values of a pixel provided by said image storage memory, wherein said wire indication is provided when said magnitudes of said color element values correspond to a wire feature.

9. The system according to claim 1 wherein said panel feature detector further comprises:

an RGB to hue extractor receiving the RGB values corresponding to each pixel being analyzed and providing a hue component corresponding to said pixel being analyzed; and a threshold adjuster having a first and a second hue parameter defining a range of hue values such that said pixel being analyzed is attributed to a wire pixel when the value of said hue component corresponding to said pixel being analyzed is within said range of hue values.

10. The system according to claim 1 wherein said panel feature detector further comprises:

a neural network having an input layer containing three nodes with linear transfer functions for distributing incoming RGB data corresponding to a pixel to be analyzed to the rest of said neural network;

a plurality of hidden layers containing a plurality of nodes, each node having connections to predetermined nodes in following layers;

an output node providing said wire indication indicating whether said pixel to be analyzed is a wire pixel or a substrate pixel.

11. The system according to claim 10 wherein said neural network is a two hidden layer fully connected feed forward network.

12. An optical inspection system for detecting faults at potential hole sites of a wire scribed circuit board having a plurality of wires scribed on a substrate, comprising:

a video camera for receiving images of desired hole sites on said wire scribed circuit board, said video camera converting each image to electrical video signals;

an image storage memory for storing color element values indicative of a chromaticity of a plurality of pixels derived from said electrical video signals;

a panel feature detector receiving said color element values of a pixel to be analyzed from said image storage memory, providing a wire indication when said color element values of said pixel correspond to a wire feature;

a pixel retrieve controller providing command signals to said image storage memory to transmit to said panel feature detector color element values corresponding to predetermined pixels associated with a hole site to be analyzed; and a short detector circuit receiving said wire indication from said panel feature detector corresponding to said predetermined pixels associated with said hole site, said short detector circuit determining whether a short circuit could occur when said hole site is drilled;

wherein said pixel retrieve controller further comprises a short scan table associated with a hole site having a plurality of corresponding scan lines said short scan table for each said scan line storing boundary values for a short circuit region, where said boundary values are used to derive said command signals.

13. The system according to claim 12 wherein said stored boundary values include the number of pixels from a vertical diameter crossing through said hole site to the outer and inner circles formed by said short circuit region.

14. The system according to claim 12 wherein said panel feature detector further comprises:

a wire look up table representing a three dimensional RGB space, said wire look up table addressed by a number corresponding to the magnitude of said color element values of a pixel provided by said image storage memory, wherein said wire indication is provided when said magnitudes of said color element values correspond to a wire feature.

15. An optical inspection system for detecting faults at potential hole sites of a wire scribed circuit board having a plurality of wires scribed on a substrate, comprising:

a video camera for receiving images of desired hole sites on said wire scribed circuit board, said video camera converting each image to electrical video signals;

an image storage memory for storing color element values indicative of a chromaticity of a plurality of pixels derived from said electrical video signals;

a panel feature detector receiving said color element values of a pixel to be analyzed from said image storage memory, providing a wire indication when said color element values of said pixel correspond to a wire feature;

a pixel retrieve controller providing command signals to said image storage memory to transmit to said panel feature detector color element values corresponding to predetermined pixels associated with a hole site to be analyzed; and a short detector circuit receiving said wire indication from said panel feature detector corresponding to said predetermined pixels associated with said hole site, said short detector circuit determining whether a short circuit could occur when said hole site is drilled;

wherein said predetermined pixels correspond to an annular short circuit region superimposed on said hole site and said short detector circuit further comprises:

a bin histogram having a plurality of bins dividing said annular short circuit region into equal parts, each bin having a corresponding bin number, said bin histogram storing the number of detected wire pixels associated with each bin number;

a digital filter for processing data stored in said bin histogram for identifying the peak occurrences of said detected wire pixels; and an analyzer for determining whether the ratio of the number of wire pixels detected in the highest two peak occurrences over the total number of pixels in said bin histogram is above a predetermined threshold.

16. An optical inspection system for detecting faults at hole sites of a wire scribed circuit board having a plurality of wires scribed on a substrate, comprising:

a video camera for receiving images of desired hole sites on said wire scribed circuit board, said video camera converting each image to electrical video signals;

an image storage memory for storing color element values indicative of the chromaticity of a plurality of pixels derived from said electrical video signals;

a panel feature detector receiving said color element values of a pixel to be analyzed from said image storage memory, providing a wire indication when said color element values of said pixel correspond to a wire feature;

a pixel retrieve controller providing command signals to said image storage memory to transmit to said panel feature detector color element values corresponding to predetermined pixels associated with a hole site to be analyzed;

a fault detector circuit receiving said wire indication from said panel feature detector corresponding to said predetermined pixels associated with said hole site, said fault detector determining whether a fault is present at said hole site; and a registration analyzer that aligns said wire scribed circuit board with respect to a desired location comprising:

a row profile buffer receiving said wire pixel indication from said panel feature detector;

a column profile buffer receiving said wire pixel indication from said panel feature detector;

a cluster identifier for recognizing significant wire pixel peak occurrences in said row and column profile buffers;

a cluster analyzer for determining the x-y coordinates of the center of said wire pixel peak occurrences corresponding to data in said row profile buffer and said column profile buffer; and a compensator for comparing the desired location of said center and actual location of said center determined by said cluster analyzer and computing a transformation matrix so that errors arising from an improper alignment of said wire scribed circuit board can be compensated.

17. An optical inspection system for detecting faults at hole sites of a wire scribed circuit board having a plurality of wires scribed on a substrate, comprising:

a video camera for receiving images of desired hole sites on said wire scribed circuit board, said video camera converting each image to electrical video signals;

an image storage memory for storing color element values indicative of the chromaticity of a plurality of pixels derived from said electrical video signals;

a panel feature detector receiving said color element values of a pixel to be analyzed from said image storage memory, providing a wire indication when said color element values of said pixel correspond to a wire feature;

a pixel retrieve controller providing command signals to said image storage memory to transmit to said panel feature detector color element values corresponding to predetermined pixels associated with a hole site to be analyzed;

a fault detector circuit receiving said wire indication from said panel feature detector corresponding to said predetermined pixels associated with said hole site, said fault detector determining whether a fault is present at said hole site; and wherein said panel feature detector further comprises:

a wire look up table representing a three dimensional RGB space said wire look up table addressed by a number corresponding to the magnitude of color element values of a pixel provided by said image storage memory, where the data corresponding to said address is set to "1" when said color element values of said pixel correspond to a wire pixel, where the data has been stored during a previous training mode;

a substrate look up table representing a three dimensional RGB space addressed by a number corresponding to the magnitude of color element values of a pixel provided by said image storage memory, where the data corresponding to said address is set to "1" when said color element values of said pixel correspond to a substrate pixel, where the data has been stored during a previous training mode; and an inhibitor for setting an addressed bit in said wire look up table back to zero whenever the same color element values of a pixel have set an addressed bit in both wire and substrate lookup tables to "1".

18. The system according to claim 17 further comprising a dilator locating set bits in said wire and substrate look up table with a value "one" and setting immediate neighbors of said set bits in all three dimensions of said RGB space corresponding to said wire and substrate look up tables with a value "1".

19. An optical inspection system for differentiating wires from substrate in a wire scribed circuit board having a plurality of wires scribed on said substrate, comprising:
   a video camera for receiving desired images on said wire scribed circuit board, said video camera converting each image to electrical video signals;
   conversion means for converting said electrical video signals into a plurality of scan lines having a plurality of pixels;
   a memory means for storing information representing RGB color element values contained in each of said pixels of said image;
   means for sampling regions on said wire scribed circuit board during a training mode;
   a wire look up table for representing points in RGB space corresponding to wire features and a substrate look up table for representing points in RGB space corresponding to substrate features, where the contents of said wire look up table are determined from samples of wire regions obtained by said sampling means, and the contents of said substrate look up table are determined from samples of substrate regions obtained by said sampling means.

20. The system according to claim 19, wherein each of said tables have a plurality of bytes and said wire look up table and said substrate look up table are addressed by a combination of binary values representing each component of said RGB color element values, wherein the least three significant bits of said address point to a bit location in one of said bytes and the remaining most significant bits of said address point to a byte location.

21. The system according to claim 20 wherein all RGB values that belong to wire features will address a "one" bit in said wire look up table and all RGB values that belong to a substrate feature will address a "one" bit in said substrate look up table.

22. The system according to claim 21 wherein an addressed bit in said wire look up table is set back to "zero" whenever the same RGB values corresponding to a pixel have set an addressed bit in said substrate look up table to "one".

23. A method for detecting faults at hole sites of a plurality of wire scribed circuit boards each having a plurality of wires scribed on a substrate, comprising the steps of:
   receiving desired images from each wire scribed circuit board;
   converting each one of said desired images to a plurality of pixels;
   deriving color element values indicative of chromaticity corresponding to each pixel of said desired images;
   displaying said desired images from said wire scribed circuit board;
   providing a training mode for a sample wire scribed circuit board by,
   sampling wire regions of said circuit board for retrieving color element values associated with wire;
   sampling substrate regions of said circuit board for retrieving color element values associated with substrate;
   tinting, to a first color, all pixels in said displayed image having color element values corresponding to said retrieved color element values associated with wire; and
   tinting, to a second color, all pixels in said displayed image having color element values corresponding to said retrieved color element values associated with substrate.

24. The method according to claim 23 further comprising the steps of:
   providing an inspection mode for each one of said plurality of wire scribed circuit boards by,
   retrieving color element values corresponding to predetermined pixels associated with a hole site to be analyzed and providing a wire indication when said color element values correspond to said retrieved color element values associated with wire;
   analyzing said wire indication corresponding to said predetermined pixels to determine whether a fault could occur when said hole site is drilled.

25. The method according to claim 23 further comprising the steps of:
   setting appropriate locations in a wire look up table addressed by color element values associated with wire to a "1" denoting wire indication;
   setting appropriate locations in a substrate look up table addressed by color element values associated with substrate to a "1" denoting substrate indication; and
   inhibiting an addressed bit in said wire look up table back to zero whenever the same color element values of a pixel have set an addressed bit in both wire and substrate look up tables to "1".

26. A method for detecting faults at hole sites of a plurality of wire scribed circuit boards each having a plurality of wires scribed on a substrate, comprising the steps of:
   receiving desired images from each wire scribed circuit board;
   converting each one of said desired images to a plurality of pixels;
   deriving hue values corresponding to each pixel of said desired images;
   displaying said desired images from said wire scribed circuit board;
   providing a training mode for a sample wire scribed circuit board by,
   setting two hue thresholds so that all pixels in said displayed image having hue values in a range between said two hue thresholds are associated with wire pixels and all other pixels are associated with substrate pixels.

27. An optical inspection system for detecting faults at desired inspection sites of a printed circuit board having a plurality of conductor traces disposed on a substrate, comprising:
   a video camera for receiving images of said desired inspection sites on said printed circuit board, said video camera converting each image to electrical video signals;
   an image storage memory for storing information representing color element values indicative of the chromaticity of a plurality of pixels derived from said electrical video signals;
   a panel feature detector receiving said color element values of a pixel to be analyzed from said image storage memory, providing a conductor trace indication when said color element values of said pixel correspond to a conductor trace;

a pixel retrieve controller providing command signals to said image storage memory to transmit to said panel feature detector color element values corresponding to predetermined pixels associated with said desired inspection site to be analyzed;

a fault detector circuit receiving said conductor trace indication from said panel feature detector corresponding to said predetermined pixels associated with said desired inspection site, said fault detector determining whether a fault is present at said desired inspection site; and wherein said panel feature detector is provided with a training mode where conductor trace regions are sampled for establishing color element values associated with conductor trace and substrate regions are sampled for establishing color element values associated with substrate.

28. The system according to claim 27 wherein said fault detector determines the gap between two conductor traces and compares said gap with a predetermined threshold value.

29. The system according to claim 28 wherein said fault detector further determines the width of a conductor trace to be inspected and compares said width with a predetermined threshold value.

30. The system according to claim 29 wherein said image storage memory comprises a frame grabber providing data on a scan line basis to a pixel row buffer, said pixel row buffer retaining information of all pixels contained in a scan line and providing said information to said panel feature detector on a pixel by pixel basis.

31. The system according to claim 27 further comprising a registration analyzer comprising:

a row profile buffer receiving said conductor trace pixel indication from said panel feature detector;

a column profile buffer receiving said conductor trace pixel indication from said panel feature detector;

a cluster identifier for recognizing significant conductor trace pixel peak occurrences in said row and column profile buffers;

a cluster analyzer for determining the x-y coordinates of the center of said conductor trace pixel peak occurrences corresponding to data in said row profile buffer and said column profile buffer; and a compensator for comparing the desired location of said center and actual location of said center determined by said cluster analyzer and computing a transformation matrix so that misalignment errors or said printed circuit board can be compensated.

32. The system according to claim 27 wherein said panel feature detector further comprises:

a conductor trace look up table representing a three dimensional RGB space said conductor trace look up table addressed by a number corresponding to the magnitude of color element values of a pixel provided by said image storage memory, the data corresponding to said address set to "1" when during said training mode said color element values of said pixel correspond to a conductor trace pixel;

a substrate look up table representing a three dimensional RGB space addressed by a number corresponding to the magnitudes of color element values of a pixel provided by said image storage memory, the data corresponding to said address set to "1" during said training mode when said color element values of said pixel correspond to a substrate pixel; and an inhibitor for setting an addressed bit in said wire look up table back to zero whenever the same color element values of a pixel have set an addressed bit in both wire and substrate lookup tables to "1".

33. The system according to claim 27 further comprising a dilator locating set bits in said conductor trace and substrate look up table with a value "one" and setting immediate neighbors of said set bits in all three dimensions of said RGB space corresponding to said conductor and substrate look up tables with a value "1".

34. An optical inspection system for detecting faults at desired inspection sites of a printed circuit board having a plurality of conductor traces disposed on a substrate, comprising:

a video camera for receiving images of said desired inspection sites on said printed circuit board, said video camera converting each image to electrical video signals;

an image storage memory for storing information representing color element values indicative of the chromaticity of a plurality of pixels derived from said electrical video signals;

a panel feature detector receiving said color element values of a pixel to be analyzed from said image storage memory, providing a conductor trace indication when said color element values of said pixel correspond to a conductor trace;

a pixel retrieve controller providing command signals to said image storage memory to transmit to said panel feature detector color element values corresponding to predetermined pixels associated with said desired inspection site to be analyzed;

a fault detector circuit receiving said conductor trace indication from said panel feature detector corresponding to said predetermined pixels associated with said desired inspection site, said fault detector determining whether a fault is present at said desired inspection site; and wherein said panel feature detector further comprises:

an RGB to hue extractor receiving the RGB values corresponding to each pixel being analyzed and providing a hue component corresponding to said pixel being analyzed; and a threshold adjuster having a first and a second hue parameter defining a range of hue values such that said pixel being analyzed is attributed to a trace pixel when the value of said hue component corresponding to said pixel being analyzed is within said range of hue values.

35. The system according to claim 27 wherein said panel feature detector further comprises:

a neural network having an input layer containing three nodes with linear transfer functions for distributing incoming RGB data corresponding to a pixel to be analyzed to the rest of said neural network;

a plurality of hidden layers containing a plurality of nodes, each node having connections to predetermined nodes in following layers;

an output node indicating whether said pixel to be analyzed is a conductor trace pixel or a substrate pixel.

36. The system according to claim 35 wherein said neural network is a two hidden layer fully connected feed forward network.

37. A method for detecting shorts at potential hole sites of a wire scribed circuit board having a plurality of wires scribed on a substrate, comprising the steps of:

receiving desired images from said wire scribed circuit board;

converting said desired images to a plurality of pixels;

retrieving from said plurality of pixels those pixels located within boundaries of an annular short circuit reticle superimposed on a hole site;

analyzing said retrieved pixels so as to provide wire indications indicating whether said pixels correspond to wires scribed on said substrate;

dividing said annular short circuit reticle into equal parts each said equal part encompassing a plurality of said retrieved pixels and associated with a bin;

assigning to each bin a bin value indicative of the number of said wire indications occurring within said bin's associated equal part; and processing said bin values to identify clusters for determining whether a short circuit could occur when said hole site is drilled.

38. The method according to claim 37 wherein said converting step includes associating color element values to said plurality of pixels and said analyzing step retrieves said color elements values so as to provide wire indications when said color element values correspond to wires scribed on said substrate.

39. The method according to claim 37 wherein said step of retrieving pixels further includes the step of deriving boundary parameters for said annular short circuit reticle from a short scan table associated with a hole site.

40. The method according to claim 37, wherein said step of determining a short circuit further comprises the steps of:

providing a histogram of said bin values;

processing said histogram for identifying the peak occurrences of said wire indications; and determining whether the ratio of the number of wire indications detected in the highest two peak occurrences to the total number of wire indications in said histogram exceeds a predetermined threshold.

* * * * *